(12) United States Patent
Nakamatsu et al.

(10) Patent No.: US 10,692,680 B2
(45) Date of Patent: Jun. 23, 2020

(54) ELECTRON EMISSION DEVICE AND METHOD FOR MANUFACTURING THE SAME

(71) Applicant: Sharp Kabushiki Kaisha, Sakai, Osaka (JP)

(72) Inventors: Kenichiro Nakamatsu, Sakai (JP); Tokio Taguchi, Sakai (JP); Kohji Shinkawa, Sakai (JP); Mai Takasaki, Sakai (JP); Tadashi Iwamatsu, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/369,004

(22) Filed: Mar. 29, 2019

(65) Prior Publication Data
US 2019/0304732 A1 Oct. 3, 2019

(30) Foreign Application Priority Data

Mar. 30, 2018 (JP) .................................. 2018-069646

(51) Int. Cl.
*H01J 3/02* (2006.01)
*H01L 21/02* (2006.01)
(Continued)

(52) U.S. Cl.
CPC ............. *H01J 3/021* (2013.01); *H01J 9/025* (2013.01); *H01L 21/02145* (2013.01); *H01L 21/76801* (2013.01)

(58) Field of Classification Search
None
See application file for complete search history.

(56) References Cited

U.S. PATENT DOCUMENTS

2005/0067935 A1* 3/2005 Lee .................. H01J 1/3044
313/309
2006/0138394 A1* 6/2006 Den .................. B81B 1/002
257/3

(Continued)

FOREIGN PATENT DOCUMENTS

JP 2001-143600 A 5/2001
JP 2003-229045 A 8/2003
(Continued)

OTHER PUBLICATIONS

Iwamatsu et al., "Novel Charging System by Electron Emission Device in the Atmosphere", Journal of the Imaging Society of Japan, vol. 56, No. 1, 2017, 5 pages.
(Continued)

*Primary Examiner* — Crystal L Hammond
(74) *Attorney, Agent, or Firm* — Keating & Bennett, LLP

(57) ABSTRACT

A method of producing an electron emitting device includes: step A of providing an aluminum substrate or providing an aluminum layer supported by a substrate; step B of anodizing a surface of the aluminum substrate or a surface of the aluminum layer to form a porous alumina layer having a plurality of pores; step C of applying Ag nanoparticles in the plurality of pores to allow the Ag nanoparticles to be supported in the plurality of pores; step D of, after step C, applying a dielectric layer-forming solution onto substantially the entire surface of the aluminum substrate or the aluminum layer, the dielectric layer-forming solution containing, in an amount of not less than 7 mass % but less than 20 mass %, a polymerization product having siloxane bonds; step E of, after step D, at least reducing a solvent contained in the dielectric layer-forming solution to form the dielectric layer; and step F of forming an electrode on the dielectric layer.

13 Claims, 13 Drawing Sheets

(51) Int. Cl.
   *H01L 21/768*   (2006.01)
   *H01J 9/02*     (2006.01)

(56) References Cited

U.S. PATENT DOCUMENTS

| | | |
|---|---|---|
| 2006/0138664 A1 | 6/2006 | Ito et al. |
| 2010/0278561 A1 | 11/2010 | Kanda et al. |
| 2013/0175177 A1* | 7/2013 | Mardilovich .......... C25D 11/12 |
| | | 205/50 |
| 2013/0177738 A1* | 7/2013 | Mardilovich ....... B81C 1/00031 |
| | | 428/141 |

FOREIGN PATENT DOCUMENTS

| | | |
|---|---|---|
| JP | 2004-014406 A | 1/2004 |
| JP | 2004-178863 A | 6/2004 |
| JP | 2009-146891 A | 7/2009 |
| JP | 2016-136485 A | 7/2016 |

OTHER PUBLICATIONS

Nakamatsu et al., "Electron Emission Device, Method for Manufacturing Same, and Method For Manufacturing Electronic Device", U.S. Appl. No. 16/127,670, filed Sep. 11, 2018.

Hayashi et al., "Electron Emission Element and Method for Same", U.S. Appl. No. 16/613,540, filed Nov. 14, 2019.

* cited by examiner

1μm

500nm

— INTRA-DEVICE CURRENT Id [A/cm²]
— EMISSION CURRENT Ie [A/cm²]
— EMISSION EFFICIENCY η [%]

ELECTRON EMISSION DEVICE AND METHOD FOR MANUFACTURING THE SAME

BACKGROUND

1. Technical Field

The present invention relates to an electron emitting device and a method of producing the same.

2. Description of the Related Art

The applicant has developed electron emitting devices which are capable of operating in the atmospheric air, each having a novel structure (see, for example, Japanese Laid-Open Patent Publication No. 2009-146891 (Japanese Patent No. 4303308; hereinafter "Patent Document 1") and Japanese Laid-Open Patent Publication No. 2016-136485 (hereinafter "Patent Document 2")).

The electron emitting device which is described in Patent Document 2 includes a semi-conductive layer which is interposed between a pair of electrodes (i.e., a substrate electrode and a surface electrode), the semi-conductive layer being composed of a dielectric material with electrically conductive nanoparticles dispersed therein. By applying a voltage on the order of several dozen volts to the semi-conductive layer, electrons can be emitted from the surface electrode (field electron emission). Therefore, unlike any conventional electron emitting device (e.g., a corona discharger) that utilizes a discharge phenomenon under a strong field, this electron emitting device has an advantage in that ozone will not be generated.

This electron emitting device can be suitably used as a charger device for charging a photosensitive drum of an image forming apparatus (e.g., a copier machine), for example. According to Tadashi IWAMATSU et al., NIHON GAZO GAKKAISHI (Journal of the Imaging Society of Japan), Vol. 56, No. 1, pp. 16-23, (2017) hereinafter "Non-Patent Document 1", an electron emitting device that includes a surface electrode of the layered structure described in Patent Document 2 may have a lifetime of about 300 hours (equivalent to approximately 300,000 sheets in the case of a medium-fast copier machine) or more.

However, there is a desire to improve the characteristics (e.g., reduced power consumption) and/or prolong the lifetime of the aforementioned electron emitting device. Accordingly, an objective of the present invention is to provide: an electron emitting device having a novel structure, such that the characteristics (e.g., reduced power consumption) of the electron emitting device can be improved and/or its lifetime can be prolonged; and a method of producing the same.

SUMMARY

A method of producing an electron emitting device according to an embodiment of the present invention comprises: step A of providing an aluminum substrate or providing an aluminum layer supported by a substrate; step B of anodizing a surface of the aluminum substrate or the aluminum layer to form a porous alumina layer having a plurality of pores; step C of applying Ag nanoparticles in the plurality of pores to allow the Ag nanoparticles to be supported in the plurality of pores; step D of, after step C, applying a dielectric layer-forming solution onto substantially the entire surface of the aluminum substrate or the aluminum layer, the dielectric layer-forming solution containing, in an amount of not less than 7 mass % but less than 20 mass %, a polymerization product having siloxane bonds; step E of, after step D, at least reducing a solvent contained in the dielectric layer-forming solution to form a dielectric layer; and step F of, after step E, forming an electrode on the dielectric layer.

In one embodiment, the dielectric layer-forming solution contains the polymerization product having siloxane bonds in an amount of about 10 mass %.

In one embodiment, step D comprises a step of applying the dielectric layer-forming solution via coating or printing.

In one embodiment, step D comprises a step of coating the dielectric layer-forming solution via spin coating.

In one embodiment, step F comprises: step F1 of depositing an electrically conductive film on the dielectric layer; and step F2 of patterning the electrically conductive film to form the electrode.

In one embodiment, the electrode comprises a metal.

In one embodiment, the surface of the aluminum substrate or the aluminum layer provided in step A is partially covered by an inter-electrode dielectric layer.

In one embodiment, step A comprises: step A1 of providing an aluminum substrate or providing an aluminum layer supported by a substrate; and step A2 of forming the inter-electrode dielectric layer so as to include an anodized layer that is formed by anodizing a portion of the surface of the aluminum substrate or the aluminum layer provided in step A1.

In one embodiment, step E comprises a step of baking the dielectric layer-forming solution.

In one embodiment, step E comprises a step of baking the dielectric layer-forming solution at 220° C. or below.

In one embodiment, step E comprises a step of baking the dielectric layer-forming solution at a boiling point of the solvent or above.

In one embodiment, step B further comprises an etching step to be performed after the anodization.

In one embodiment, step B comprises a further anodization step after the etching step.

An electron emitting device according to an embodiment of the present invention comprises a first electrode, a second electrode, and a semi-conductive layer provided between the first electrode and the second electrode, wherein, the first electrode is formed of an aluminum substrate or an aluminum layer; the semi-conductive layer includes a porous alumina layer formed at a surface of the aluminum substrate or the aluminum layer, the porous alumina layer having a plurality of pores, and includes Ag nanoparticles supported in the plurality of pores; and the electron emitting device further comprises a dielectric layer formed on the porous alumina layer and in the plurality of pores, the dielectric layer comprising a polymerization product having siloxane bonds; and each of the plurality of pores has a depth of about 1000 nm or more, and the Ag nanoparticles are distributed across a half or more of the depth and fixed on a wall surface of the pore by the dielectric layer.

In one embodiment, the dielectric layer contains substantially no carbon.

An electron emitting device according to another embodiment of the present invention comprises a first electrode, a second electrode, and a semi-conductive layer provided between the first electrode and the second electrode, wherein, the semi-conductive layer includes a porous alumina layer having a plurality of pores and silver supported in the plurality of pores of the porous alumina layer; the first electrode is formed of an aluminum substrate containing aluminum in an amount of not less than 99.00 mass % and not more than 99.99 mass %; and the porous alumina layer is an anodized layer formed at a surface of the aluminum substrate.

In one embodiment, aluminum is contained in an amount of 99.98 mass % or less in the aluminum substrate.

In one embodiment, the porous alumina layer has a thickness which is not less than 10 nm and not more than 5 μm.

In one embodiment, the plurality of pores each have an opening having a two-dimensional size which is not less than 50 nm and not more than 3 μm as viewed from a normal direction of a surface thereof.

In one embodiment, the plurality of pores of the porous alumina layer each have a depth which is not less than 10 nm and not more than 5 μm. Each of the plurality of pores of the porous alumina layer may have a depth which is not less than 50 nm and not more than 500 nm.

In one embodiment, a barrier layer included in the porous alumina layer has a thickness which is not less than 1 nm and not more than 1 μm. A barrier layer included in the porous alumina layer may have a thickness of 100 nm or less.

In one embodiment, the plurality of pores of the porous alumina layer each have a stepped side surface. Each of the plurality of pores has, along a depth direction, two or more pore subportions with mutually differing pore diameters, such that any pore subportion at a deeper position has a smaller pore diameter.

In one embodiment, the silver contains Ag nanoparticles having an average particle size which is not less than 1 nm and not more than 50 nm. The silver may contain Ag nanoparticles with an average particle size which is not less than 3 nm and not more than 10 nm.

In one embodiment, the second electrode includes a gold layer. The second electrode has the layered structure described in Patent Document 2.

A method of producing an electron emitting device according to another embodiment of the present invention is a method of producing any of the above electron emitting devices, comprising: a step of providing an aluminum substrate containing aluminum in an amount of not less than 99.00 mass % and not more than 99.99 mass %; a step of anodizing a surface of the aluminum substrate to form a porous alumina layer; and a step of applying Ag nanoparticles in a plurality of pores of the porous alumina layer.

In one embodiment, aluminum is contained in the aluminum substrate in an amount of 99.98 mass % or less.

In one embodiment, the step of forming the porous alumina layer comprises an anodization step and an etching step to be performed after the anodization step.

In one embodiment, the step of forming the porous alumina layer comprises a further anodization step after the etching step.

According to an embodiment of the present invention, there is provided: an electron emitting device having an a novel structure such that its characteristics (e.g., reduced power consumption) can be improved and/or its lifetime can be prolonged as compared to the aforementioned conventional technique; and a method of producing the same.

DETAILED DESCRIPTION

Figure 1:
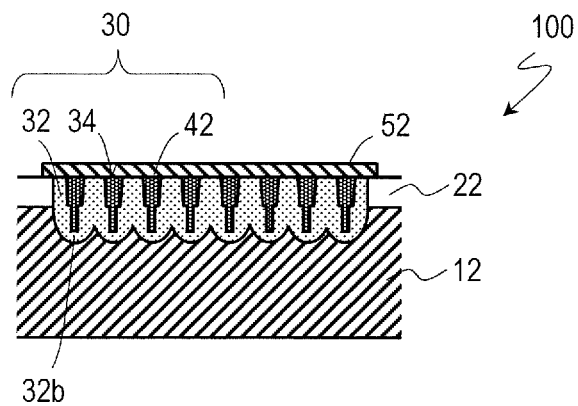
FIG. 1 is a schematic cross-sectional view of an electron emitting device 100 according to an embodiment of the present invention.

Hereinafter, with reference to the drawings, electron emitting devices according to embodiments of the present invention and methods of producing the same will be described.

Embodiments of the present invention are not to be limited to the illustrated embodiments. In the following description, constituent elements with like functions are denoted by like reference numerals, and redundant description will be avoided.

FIG. 1 shows a schematic cross-sectional view of an electron emitting device 100 according to an embodiment of the present invention.

The electron emitting device 100 includes a first electrode 12, a second electrode 52, and a semi-conductive layer 30 interposed between the first electrode 12 and the second electrode 52. The first electrode 12 is composed of an aluminum substrate 12 (e.g., a thickness of 0.5 mm), for example, whereas the second electrode 52 is composed of a gold (Au) layer (e.g., 40 nm thick), for example. The dielectric layer 22 may function as a device separation layer when a plurality of electron emitting devices 100 are to be produced on an aluminum substrate. The size of a single electron emitting device 100 (i.e., the size of a region surrounded by the dielectric layer 22) may be e.g., about 5 mm×about 5 mm (5 mm□), and the dielectric layer 22 has a width of about 5 mm. The dielectric layer 22 may be omitted when just forming a single electron emitting device 100. However, providing the dielectric layer 22 may result in the advantages of an ability to restrain a concentrated electric field and a leakage current from occurring between the first electrode 12 and the second electrode 52.

The semi-conductive layer 30 includes a porous alumina layer 32 having a plurality of pores 34 and silver (Ag) 42 that is supported in the plurality of pores 34 of the porous alumina layer 32.

The plurality of pores 34 each have an opening whose two-dimensional size (Dp) as viewed from the normal direction of its surface is not less than about 50 nm and not more than about 3 µm, for example. The plurality of pores 34 may each have an opening whose two-dimensional size (Dp) as viewed from the normal direction of its surface is less than about 500 nm. In the present specification, an "opening" refers to an uppermost portion of a pore 34. If a pore 34 has two or more pore subportions with mutually differing pore diameters along the depth direction, regarding the varying pore diameter, the pore diameter of the uppermost portion is referred to as the opening diameter. The "two-dimensional size" means an area equivalent circle diameter of the opening (pore 34) as viewed from the normal direction of its surface. In the following description, any reference to "two-dimensional size", "opening diameter", or "pore diameter" is intended to be an area equivalent circle diameter. Details of the porous alumina layer 32 will be described later with reference to FIGS. 3A, 3B and 3C.

The silver supported in the pores 34 may be, for example, nanoparticles of silver (hereinafter denoted as "Ag nanoparticles"). The Ag nanoparticles preferably have an average particle size of not less than 1 nm and not more than 50 nm, for example. More preferably, the Ag nanoparticles have an average particle size of not less than 3 nm and not more than 10 nm, for example. The Ag nanoparticles may be coated with an organic compound (e.g., an alcohol derivative and/or surfactant).

The first electrode 12 is composed of an aluminum substrate (e.g., 0.5 mm thick), for example, whereas the porous alumina layer 32 is an anodized layer formed on the surface of the aluminum substrate. Instead of an aluminum substrate, an aluminum layer which is formed on a substrate (e.g., a glass substrate) may be used. In other words, the porous alumina layer 32 may be an anodized layer which is formed at the surface of an aluminum layer that is supported by a substrate. In this case, if the substrate is a dielectric substrate such as a glass substrate, an electrically conductive layer may be formed between the aluminum layer and the substrate, and the aluminum layer and the electrically conductive layer may be utilized as electrodes. Any aluminum layer (i.e., a portion remaining after anodization) functioning as an electrode preferably has a thickness of e.g. 10 µm or more.

The second electrode 52 is composed of a gold (Au) layer, for example. The Au layer preferably has a thickness of not less than 10 nm and not more than 100 nm, e.g. 40 nm. Otherwise, platinum (Pt) may be used. Furthermore, as described in Patent Document 2, a layered structure of an Au layer and a Pt layer may be adopted; in this case, preferably the Au layer serves as a lower layer and the Pt layer serves as an upper layer in the layered structure (Pt layer/Au layer). In the layered structure, the Pt layer preferably has a thickness of not less than 10 nm and not more than 100 nm, e.g. 20 nm, and the Au layer preferably has a thickness of not less than 10 nm and not more than 100 nm, e.g. 20 nm. As compared to forming the second electrode 52 with an Au layer alone, the Pt layer/Au layer layered structure can provide a lifetime which is about 5 times longer.

Figure 2A:
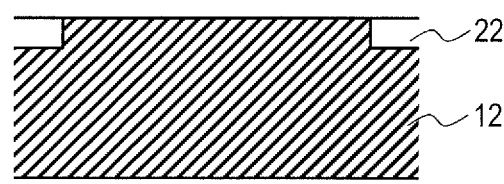
FIGS. 2A, 2B and 2C are schematic cross-sectional views for describing a method of producing the electron emitting device 100 according to an embodiment of the present invention.
Figure 2B:
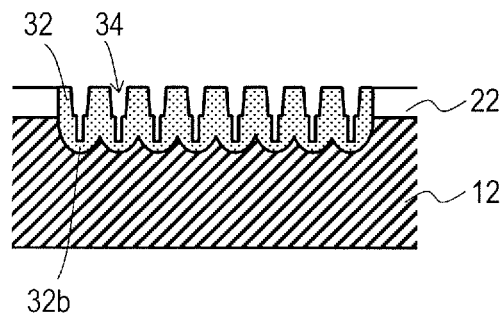
Figure 2C:
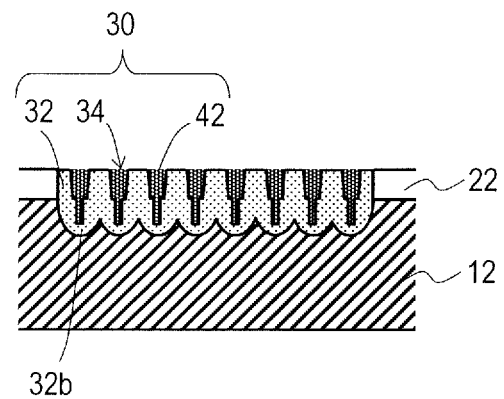

Next, with reference to FIGS. 2A, 2B and 2C, a method of producing the electron emitting device 100 will be described. FIGS. 2A, 2B and 2C show schematic cross-sectional views for describing a method of producing the electron emitting device 100 according to an embodiment of the present invention.

First, as shown in FIG. 2A, an aluminum substrate 12 having a dielectric layer 22 partially formed therein is provided. As the aluminum substrate 12, for example, JIS A1050 (thickness: 0.5 mm) may be used. The dielectric layer may be formed by performing an anodization (alumite treatment) and a sealing treatment while masking a device formation region of the surface of the aluminum substrate 12, for example. The dielectric layer 22 is formed by performing an anodization with sulfuric acid aqueous solution (15 wt %, 20° C.±1° C.) for 250 seconds to 300 seconds at a current density of 1 A/dm² to form an porous alumina layer with a thickness of 2 µm to 4 µm, and thereafter performing a sealing treatment for the porous alumina layer with distilled water (pH: 5.5 to 7.5, 90° C.) for about 30 minutes, for example.

As necessary, the surface of the aluminum substrate may be subjected to a pretreatment. For example, a microblasting treatment may be performed. Alternatively, after a porous alumina layer is formed through anodization, the porous alumina layer may be removed by etching. The pores in the porous alumina layer to be first formed are likely to be distributed irregularly (randomly). Therefore, in order to form a porous alumina layer with a regular array of pores, it is preferable to remove the porous alumina layer that was formed first.

Next, as shown in FIG. 2B, the surface of the aluminum substrate 12 is anodized in order to form the porous alumina layer 32. As will be described later with reference to FIGS. 3A, 3B and 3C, the anodization may be followed by an etching as necessary. Anodization and etching may be alternated a plurality of times. By adjusting the conditions of anodization and etching, pores 34 with various cross-sectional shapes and sizes can be formed.

Next, as shown in FIG. 2C, silver (Ag) 42 is allowed to be supported in the pores 34 of the porous alumina layer 32. In the case where Ag nanoparticles are used as Ag, a dispersion obtained by dispersing Ag nanoparticles in an organic solvent (e.g., toluene) is applied onto the porous alumina layer 32. The Ag nanoparticles within the dispersion may be coated with an organic compound (e.g., an alcohol derivative and/or a surfactant). The content ratio of Ag nanoparticles in the dispersion is preferably e.g. not less than 0.1 mass % and not more than 10 mass %, and may be 2 mass %, for example. The method of applying the dispersion is not particularly limited. For example, spin coating, spray coating, or the like may be used.

Next, with reference to FIGS. 3A, 3B and 3C, the structure of the porous alumina layer 32 of the electron emitting device 100 will be described. The porous alumina layer 32 may be any of porous alumina layers 32A, 32B and 32C shown in FIGS. 3A, 3B and 3C, for example. Moreover, without being limited to the porous alumina layers 32A, 32B and 32C, the porous alumina layer 32 admits of various modifications, as will be described below.

The porous alumina layer is formed by, for example, allowing the surface of an aluminum substrate (within which portions that were not anodically oxidized will become the first electrode 12) to undergo anodization in an acidic electrolytic solution. The electrolytic solution to be used in the step of forming the porous alumina layer may be, for example, an aqueous solution that contains an acid which is selected from the group consisting of oxalic acid, tartaric acid, phosphoric acid, chromic acid, citric acid, and malic acid. By adjusting the conditions of anodization (e.g., the kind of electrolytic solution, applied voltage), it is possible to control the opening diameter Dp, the interpore distance Dint, the pore depth Dd, the thickness tp of the porous alumina layer, and the thickness tb of the barrier layer. A porous alumina layer which is obtained through anodization may have, for example, cylindrical pores 34B as in the porous alumina layer 32B shown in FIG. 3B.

After the anodization, the porous alumina layer may be placed in contact with an etchant for alumina and subjected to a predetermined amount of etching so as to enlarge the pore diameter. With wet etching, the pore wall and the barrier layer can be etched substantially isotropically. By adjusting the kind of etchant and its concentration, as well as the etching time, it is possible to control the etching amount (that is, the opening diameter Dp, interpore distance Dint, pore depth Dd, the barrier layer thickness tb, etc.). Examples of etchants that may be used are: an aqueous solution of phosphoric acid; an aqueous solution of an organic acid, e.g., formic acid, acetic acid, or citric acid; or a chromic and phosphoric acid mixture aqueous solution. A porous alumina layer which is obtained by performing etching only once after the anodization will have cylindrical pores 34B, as in the porous alumina layer 32B illustrated in FIG. 3B. However, the opening diameter Dp of the pores 34B and the thickness tb of the barrier layer 32b have changed through the etching.

For example, an anodization may be performed with oxalic acid aqueous solution (0.05 M, 5° C.) and a formation voltage of 80 V for about 25 minutes; thereafter, 20 minutes of etching may be performed with phosphoric acid aqueous solution (0.1 M, 25° C.); as a result, a porous alumina layer 32B having a depth Dd of about 2000 nm, an opening diameter Dp of 100 nm, an interpore distance Dint of 200 nm, and a barrier layer thickness tb of about 30 nm can be obtained.

In another example, for example, an anodization may be performed with oxalic acid aqueous solution (0.05 M, 5° C.) and a formation voltage of 80 V for about 10 minutes; thereafter, 20 minutes of etching may be performed with phosphoric acid aqueous solution (0.1 M, 25° C.); as a result, a porous alumina layer 32B having a depth Dd of about 700 nm, an opening diameter Dp of 100 nm, an interpore distance Dint of 200 nm, and a barrier layer thickness tb of 50 nm can be obtained.

After the etching step, a further anodization may be performed to grow the pores in the depth direction, and also to thicken the porous alumina layer. Since the pore growth begins from the bottoms of the pores that have already been formed, each pore will have a stepped side surface. As a result, pores 34A having a stepped side surface are obtained, as illustrated in FIG. 3A. Along the depth direction, each pore 34A has two pore subportions with mutually differing pore diameters, such that the pore subportion at a deeper position has a smaller pore diameter. For example, as shown in FIG. 3A, the subportion at a deeper position (depth Dd1, pore diameter Dp1) has a smaller pore diameter Dp1 than the opening diameter Dp. A pore 34A having a stepped side surface is capable of catching an Ag nanoparticle(s) at the step portion(s), thus providing an advantage of being able to support many Ag nanoparticles in the pore 34A. For example, among the plurality of pores 34, any pore that has an opening diameter which is not less than about 100 nm and not more than about 3 μm preferably includes a pore subportion at a deeper position, this pore subportion having a pore diameter of not less than 50 nm and not more than 500 nm.

The porous alumina layer 32A may be formed in the following manner, for example. An anodization may be performed with oxalic acid aqueous solution (0.05 M, 5° C.) and a formation voltage of 80 V for about 10 minutes; thereafter, 20 minutes of etching with phosphoric acid aqueous solution (0.1 M, 25° C.) is performed; thereafter again, an anodization may be performed with oxalic acid aqueous solution (0.05 M, 5° C.) and a formation voltage of 80 V for about 20 minutes; as a result, a porous alumina layer 32A having a depth Dd of about 1500 nm, an opening diameter Dp of 100 nm, an interpore distance Dint of 200 nm, and a barrier layer thickness tb of 50 nm can be obtained. Herein, along the depth direction, each pore 34A has two pore subportions with mutually differing pore diameters, such that it has a pore subportion with a depth Dd1 of 500 nm and a pore diameter Dp1 of about 20 nm at a deeper position.

Further thereafter, as necessary, the porous alumina layer may be placed in contact with an etchant for alumina in order to perform further etching, thus further enlarging the pore diameter. As the etchant, the aforementioned etchants are preferable here also.

By repeating anodization steps and etching steps, pores can be formed each having two or more pore subportions with mutually differing pore diameters along the depth direction, such that any pore subportion at a deeper position has a smaller pore diameter, for example. Furthermore, as in the porous alumina layer 32C illustrated in FIG. 3C, pores 34C each having a sloped side surface (note that sufficiently small steps will result in the appearance of a slope) can be formed. The overall shape of each pore 34C is substantially conical (although the cone is situated upside down). The applicant has established a technique of mass-producing an antireflection film having a moth-eye structure by using a porous alumina layer having conical pores as a mold.

Figure 3A:
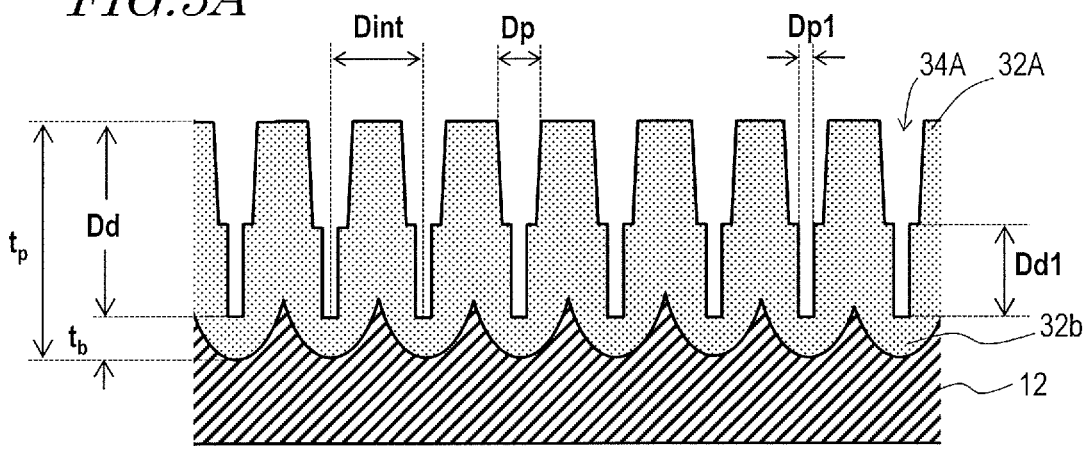
FIGS. 3A, 3B and 3C are schematic cross-sectional views showing examples of porous alumina layers for use as the semi-conductive layer of the electron emitting device 100.
Figure 3B:
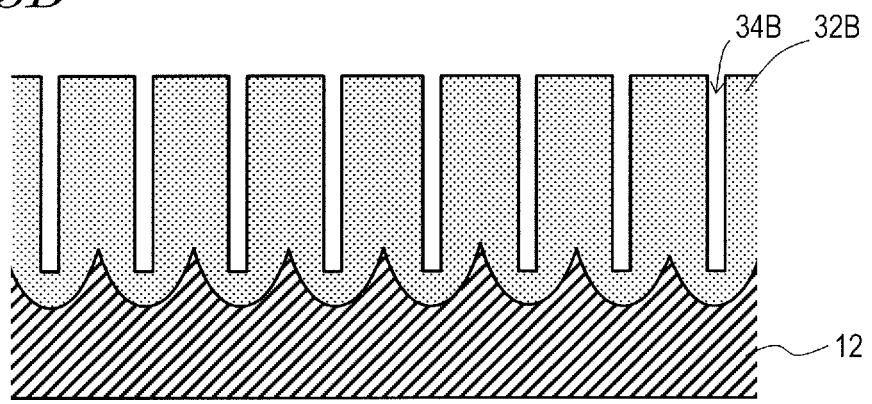
Figure 3C:
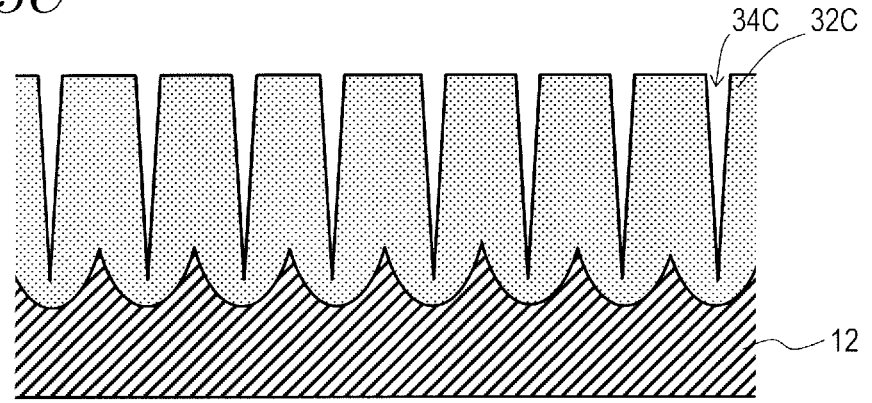

As described above, the porous alumina layer 32 may be any of the porous alumina layers 32A, 32B and 32C shown in FIGS. 3A, 3B and 3C, but admits of various modifications without being limited to these. Regardless of the shape of the porous alumina layer 32, the thickness tp of the porous alumina layer 32 is not less than about 10 nm and not more than about 5 μm, for example. If it is thinner than 10 nm, enough silver (e.g., Ag nanoparticles) cannot be supported, so that a desired electron emission efficiency may be not be obtained. Although there is no upper limit for the thickness tp of the porous alumina layer 32, the electron emission efficiency tends to be saturated even if the porous alumina layer 32 becomes any thicker; thus, from a production efficiency standpoint, there is no need for a thickness that is greater than 5 μm.

The depth Dd of the plurality of pores 34 in the porous alumina layer 32 may be e.g. not less than 10 nm and not more than 5 μm. The depth Dd of the plurality of pores 34 may be e.g. not less than 50 nm and not more than 500 nm. The depth Dd of the plurality of pores 34 may be set as appropriate, depending on the thickness of the porous alumina layer 32.

The thickness tb of the barrier layer 32b of the porous alumina layer 32 is preferably not less than 1 nm and not more than 1 μm. More preferably, the thickness tb of the barrier layer 32b is 100 nm or less. The barrier layer 32b is a layer constituting the bottom of the porous alumina layer 32. If the barrier layer 32b is thinner than 1 nm, short-circuiting may occur upon voltage application; on the other hand, if it is thicker than 1 μm, a sufficient voltage may not be applied to the semi-conductive layer 30. Generally speaking, the thickness tb of the barrier layer 32b of the porous alumina layer 32 depends on the interpore distance Dint and the opening diameter (two-dimensional size) Dp of the pores 34 and the conditions of anodization.

Hereinafter, by way of experimental examples, the electron emitting device 100 according to an embodiment of the present invention will be described in more detail.

Figure 4A:
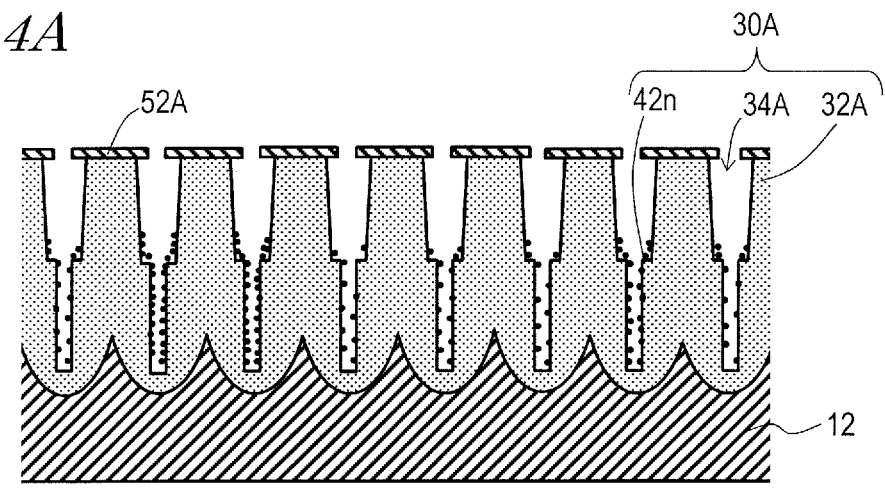
FIGS. 4A, 4B and 4C are schematic cross-sectional views showing differing states of Ag nanoparticles in a semi-conductive layer 30A, in an electron emitting device according to an embodiment of the present invention.
Figure 4B:
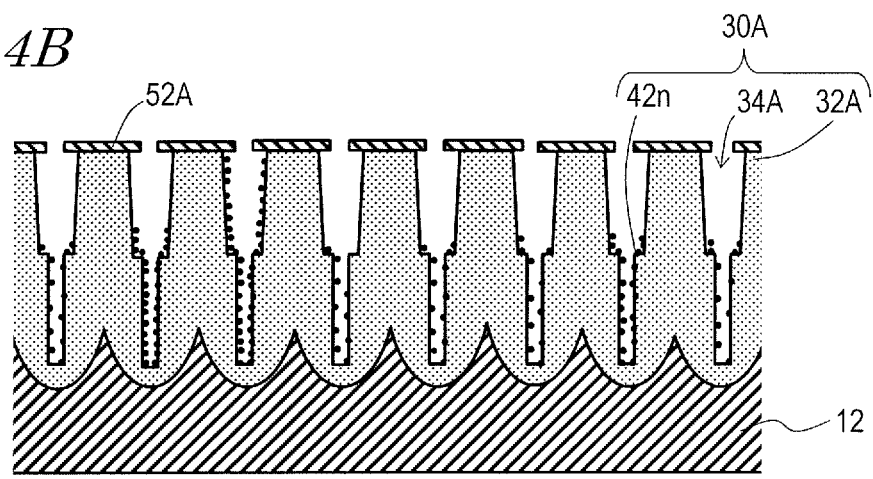
Figure 4C:
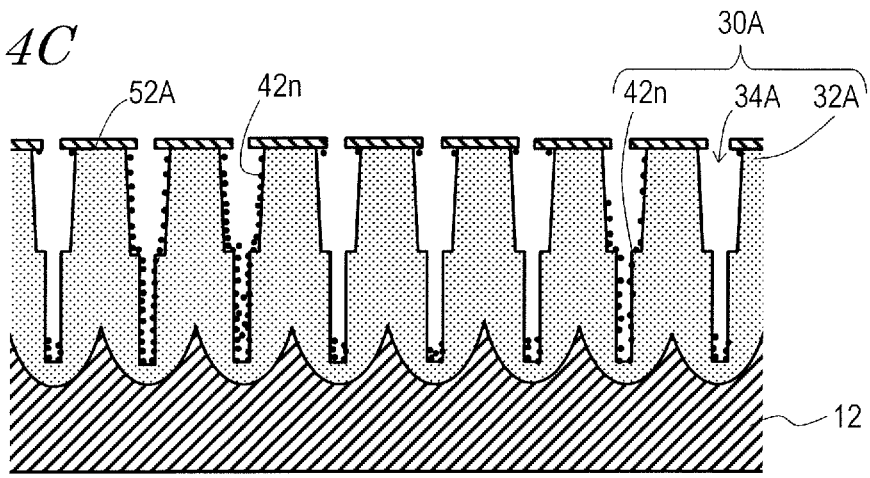

FIGS. 4A, 4B and 4C are schematic cross-sectional views showing differing states of Ag nanoparticles in the semi-conductive layer 30A, in an electron emitting device according to an embodiment of the present invention. FIG. 4A shows a state immediately after the semi-conductive layer 30A is formed; FIG. 4B shows a state after a "forming" treatment but before being driven; and FIG. 4C shows the structure during stable operation. These are all schematic illustrations based on results of observing a cross section of a prototyped device with a scanning transmission electron microscope (hereinafter "STEM").

The semi-conductive layer 30A is obtained by allowing Ag nanoparticles 42n to be supported in the porous alumina layer 32A which has been formed as described above, for example.

For the Ag nanoparticles, for example, an Ag nanoparticle dispersion obtained by dispersing alcohol derivative-coated Ag nanoparticles in an organic solvent (an average particle size of the alcohol derivative-coated Ag nanoparticles: 6 nm, dispersion solvent: toluene, Ag concentration: 1.3 mass %) can be used. For example, on a porous alumina layer 32A that is formed in a region of about 5 mm×about 5 mm, 200 μL (microliters) of the aforementioned Ag nanoparticle dispersion is added dropwise; and spin coating is performed under conditions of: e.g. 500 rpm for 5 seconds and thereafter 1500 rpm for 10 seconds. Thereafter, baking is performed at 150° C. for 1 hour, for example. For enhanced dispersibility, the Ag nanoparticles are coated with an organic substance having e.g. alkoxide and/or carboxylic acid, or a derivative thereof at its terminal end. The baking step is able to remove or reduce the organic substance.

The semi-conductive layer 30A which has just been formed, the Ag nanoparticles 42n abound in lower portions of the pores 34A, as shown in FIG. 4A.

Figure 7:
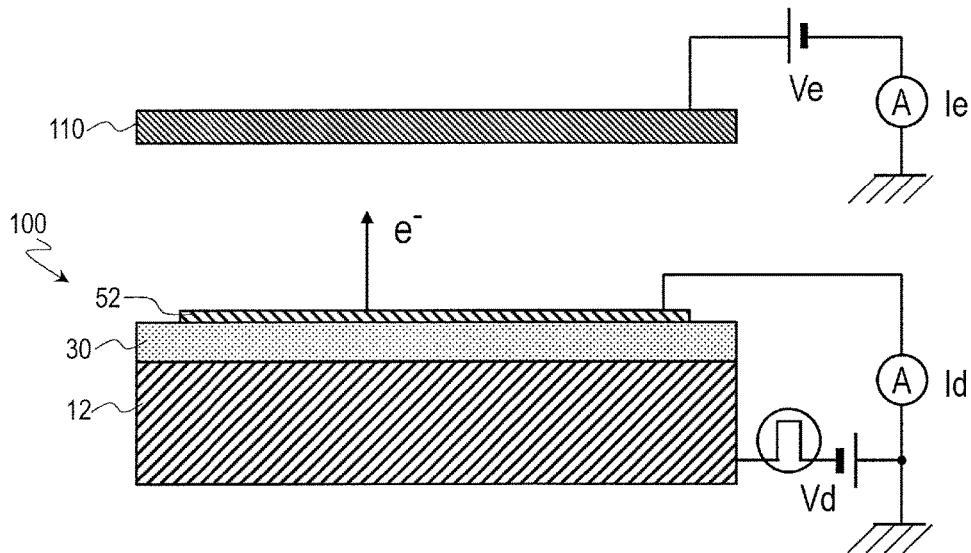
FIG. 7 is a diagram schematically showing a measurement system for the electron emission characteristics of the electron emitting device 100.

Once the "forming" treatment is performed, as shown in FIG. 4B, in some pores 34A, the Ag nanoparticles 42n are arrayed along the depth direction of the pores 34A, thereby being distributed to near the opening of the pore 34A. Electrons will be emitted from any pore 34A (e.g., the third pore 34A from the left in FIG. 4B) in which the Ag nanoparticles 42n are thus distributed to near the opening. Note that the "forming" treatment refers to a treatment that involves energization for realizing stable electron emission. Although depending on the structure of the semi-conductive layer 30A, the "forming" treatment is performed by, as the voltage to be applied to the electron emitting device 100 (e.g., a driving voltage Vd as shown in FIG. 7), using a rectangular wave having e.g. a frequency of 2 kHz and a duty ratio of 0.5, and increasing this voltage to about 20 V at a rate of 0.1 V/sec. In the present specification, the voltage to be applied to the electron emitting device 100 is expressed in terms of the potential of the second electrode 52 relative to the potential of the first electrode 12. When the voltage to be applied to the electron emitting device 100 is 20 V, for example, the potentials of the first electrode and the second electrode 52 are e.g. −20 V and 0 V, respectively. However, without being limited to this example, the potential of the first electrode 12 may be the ground potential, and the potential of the second electrode 52 may be a positive value.

While electrons are being stably emitted, as shown in FIG. 4C, it is considered that pores 34A in which the Ag nanoparticles 42n are distributed to near the opening are being consecutively formed.

Thereafter, a phenomenon occurs such that the porous alumina layer 32 is locally destroyed. This is presumably because of heat generation that is caused by electron emission.

Figure 5A:
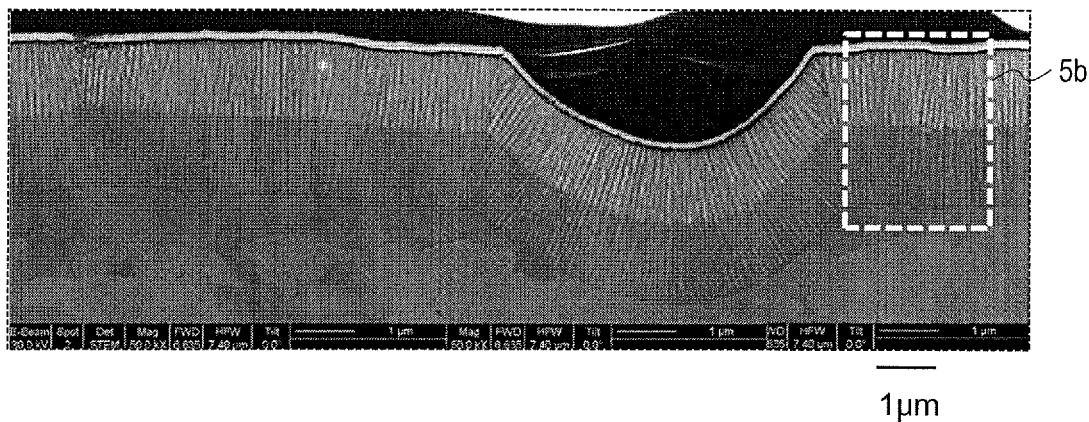
FIGS. 5A and 5B are diagrams showing cross-sectional STEM images of a semi-conductive layer containing Ag nanoparticles.
Figure 5B:
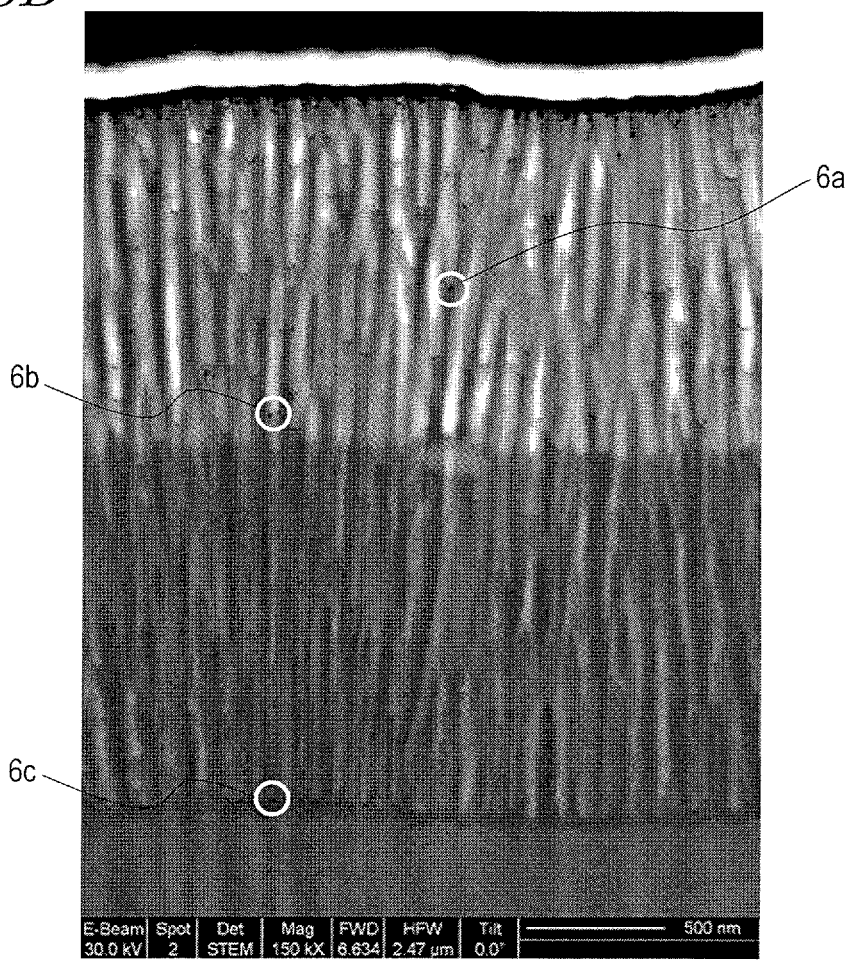
Figure 6A:
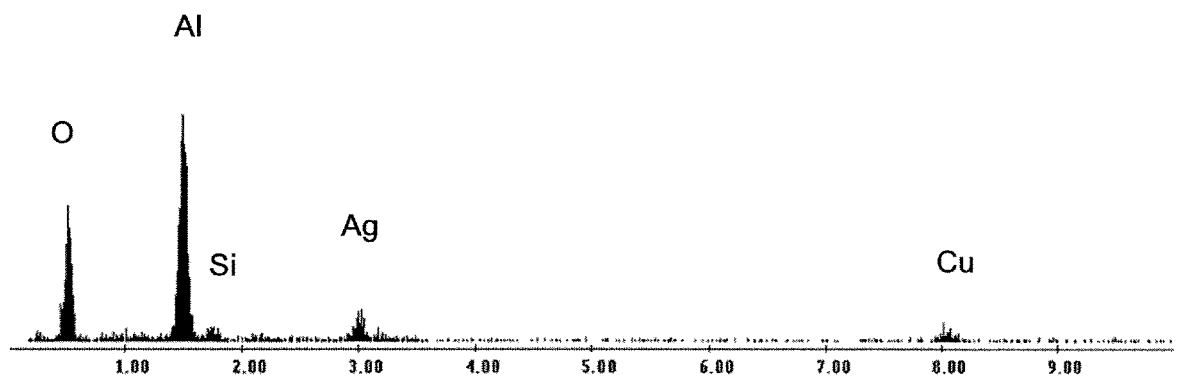
FIGS. 6A, 6B and 6C are diagrams showing results of EDX analysis in a cross section (inside open circles 6a, 6b and 6c in FIG. 5B) of a semi-conductive layer.
Figure 6B:
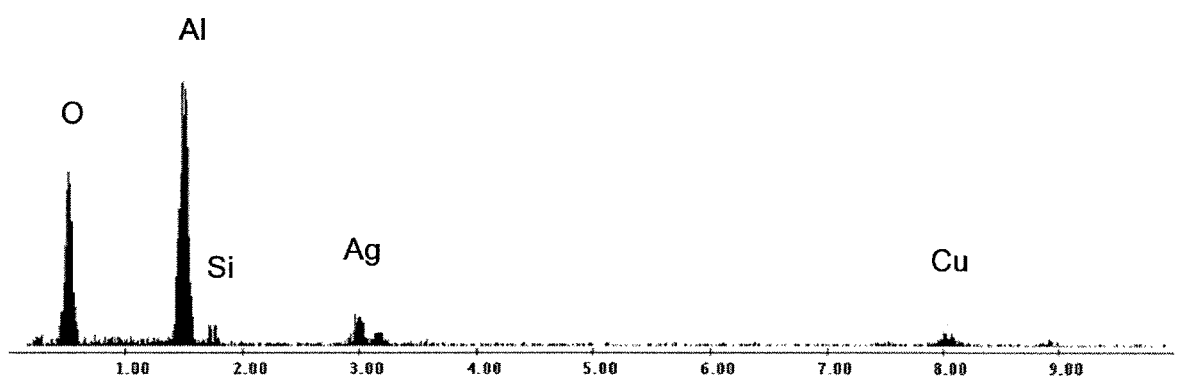
Figure 6C:
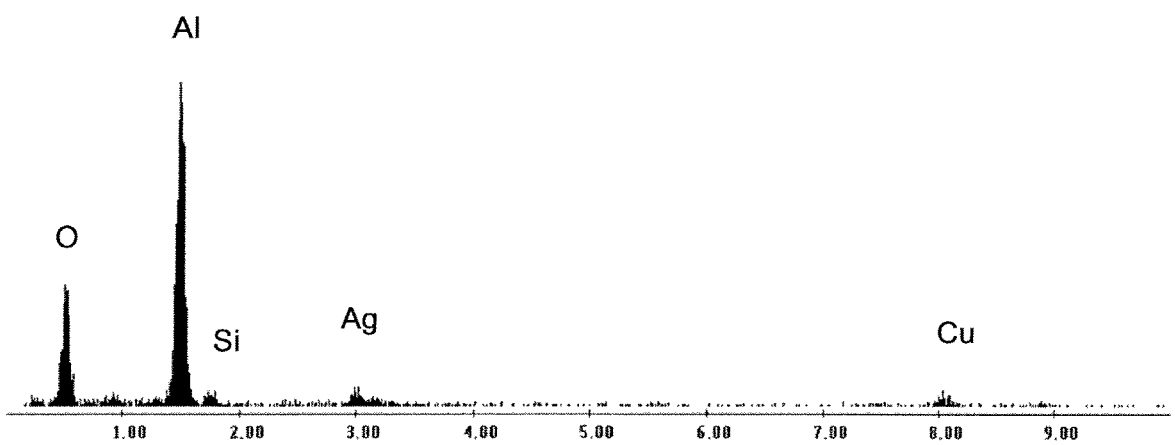

FIGS. 5A and 5B show example cross-sectional STEM images of the semi-conductive layer (which has not been energized yet) of the prototyped device. FIG. 5B shows an enlarged image of the region surrounded by a broken line 5b in FIG. 5A. FIGS. 6A, 6B and 6C show results of energy dispersive X-ray analysis (hereinafter "EDX") of regions indicated by open circles 6a, 6b and 6c in FIG. 5B (i.e., vicinities of dark dots that are considered to be the Ag nanoparticles). DB-Strata237 (available from Japan FEI) was used as the STEM, and Genesis2000 (available from EDAX, Inc.) was used as the EDX. Unless otherwise specified, this will also be the case hereinafter.

As can be seen from FIG. 5A, pores extend along the normal direction with respect to the surface. Since presence of Ag is confirmed in FIGS. 6A, 6B and 6C, the dark dots in FIG. 5B are presumed to be the Ag nanoparticles. This would indicate that the Ag nanoparticles supported in the pores are sparsely dispersed. The semi-conductive layer shown in FIGS. 5A and 5B includes the porous alumina layer 32A. In other words, each pore 34A in the porous alumina layer 32A has a stepped side surface, and has two pore subportions with mutually differing pore diameters along the depth direction. In FIGS. 5A and 5B, it is considered that the pore subportions at the deeper position produce darker images.

Figure 8:
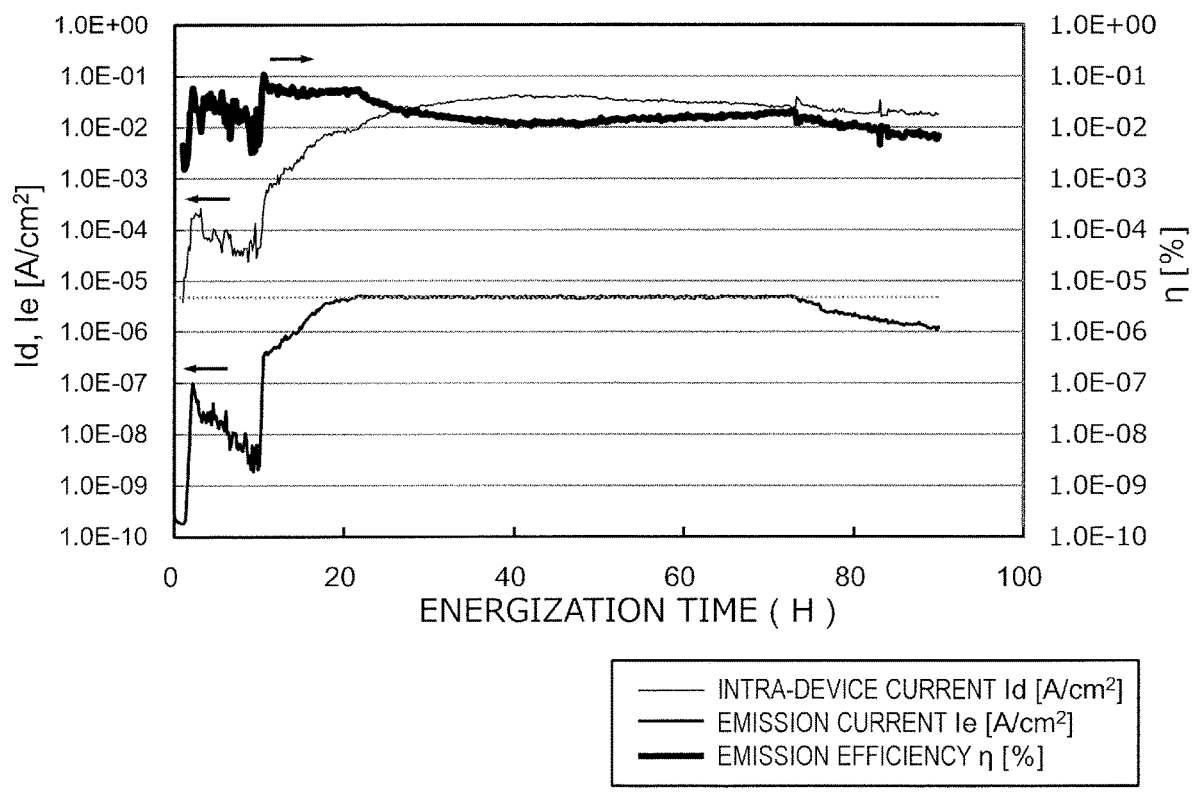
FIG. 8 is a diagram showing a result of an energization test for an electron emitting device according to Example.

With reference to FIG. 7 and FIG. 8, a result of evaluating the lifetime of the electron emitting device of Example will be described. FIG. 7 schematically shows a measurement system for the electron emission characteristics of the electron emitting device 100. FIG. 8 shows a result of an energization test (electron emission characteristics) for the electron emitting device 100 having the semi-conductive layer illustrated in FIGS. 5A and 5B.

As shown in FIG. 7, on the second electrode 52 side of the electron emitting device 100, a counter electrode 110 is disposed so as to oppose the second electrode 52, and a current that occurs in the counter electrode 110 due to the electrons that are emitted from the electron emitting device 100 was measured. The following is assumed: a driving voltage Vd which is applied to the electron emitting device 100; an intra-device current Id; a voltage Ve (which may be referred to as "collection voltage") to be applied to the counter electrode 110; and an emission current Ie occurring in the counter electrode 110. The distance between the counter electrode 110 and the second electrode 52 was 0.5 mm, and the voltage Ve applied to the counter electrode 110 was 600 V. Herein, as shown in FIG. 7, the potential of the second electrode 52 was the ground potential, and a negative voltage was applied to the first electrode 12. However, without being limited to this example, the potential of the second electrode 52 may only be higher than the potential of the first electrode 12 in order to allow electrons to be emitted from the second electrode 52.

In FIG. 8, the intra-device current Id, the emission current Ie, and the emission efficiency η are plotted against energization time. The emission efficiency η is given as η=Ie/Id. The emission efficiency η needs to be 0.01% or more, and may preferably be 0.05% or more.

The construction of the prototyped electron emitting device 100 is as follows.

first electrode 12: a portion of JIS A1050 (thickness 0.5 mm) excluding any anodically oxidized portion porous alumina layer (32A): opening diameter Dp of about 100 nm, depth Dd of about 2200 nm, interpore distance Dint of 200 nm, porous alumina layer thickness tp of 2200 nm, barrier layer thickness tb of about 50 nm deeper pore subportion: pore diameter Dp1 of about 20 nm, depth Dd1 of about 1500 nm shallower pore subportion: pore diameter (opening diameter Dp) of about 100 nm, depth of about 700 nm Ag nanoparticles 42n: alcohol derivative-coated Ag nanoparticles contained in the aforementioned Ag nanoparticle dispersion, having an average particle size of 6 nm second electrode 52: Au layer (thickness 40 nm) device size (size of the second electrode 52): 5 mm×5 mm The porous alumina layer 32A shown in FIGS. 5A and 5B was formed by: performing an anodization with oxalic acid aqueous solution (0.05 M, 5° C.) and a formation voltage of 80 V for about 27 minutes; thereafter performing 20 minutes of etching with phosphoric acid aqueous solution (0.1 M, 25° C.); and thereafter again performing an anodization with oxalic acid aqueous solution (0.05 M, 5° C.) and a formation voltage of 80 V for about 27 minutes.

After carrying out the aforementioned "forming" treatment, an energization test for the electron emitting device 100 was performed through an intermittent driving with ON periods of 16 seconds and OFF periods of 4 seconds. The driving conditions are as follows. The driving voltage Vd (pulse voltage) applied between the first electrode 12 and the second electrode 52 was a rectangular wave having a frequency of 2 kHz and a duty ratio of 0.5, and the driving voltage Vd was increased at a rate of 0.1 V/sec, until the emission current Ie reached a predefined value (which herein was 4.8 μA/cm$^2$) or greater. Thereafter, a feedback control of adjusting the driving voltage Vd was performed so that the emission current Ie as monitored with the counter electrode 110 remained constant. The driving environment was 25° C., with a relative humidity RH of 30% to 40%.

As can be seen from FIG. 8, the electron emitting device 100 of Example had a lifetime of about 50 hours. Herein, lifetime of the electron emitting device is assumed to be the length of time during which the emission current Ie maintained a certain value. Herein, assuming a usage as a charger device of a medium-fast copier machine, the length of time during which the emission current Ie maintained 4.8 μA/cm$^2$ was defined as the lifetime of the electron emitting device. This value (4.8 μA/cm$^2$) is estimated, given that the photosensitive drum of the medium-fast copier machine has a rotational speed of 285 mm/sec, to be an emission current that is needed to charge this photosensitive drum. As can be seen from FIG. 8, the emission current Ie of the electron emitting device 100 maintained 4.8 μA/cm$^2$ (i.e., a value indicated by a dotted line in FIG. 8) for about 50 hours.

From the study so far, it has been found that the lifetime can be made about 5 times longer (about 160 hours) by replacing the second electrode 74 (a single Au layer with a thickness of 40 nm) of an electron emitting device 200 of Comparative Example, which will be described later with reference to FIG. 9 (see Patent Document 2, for example), with a Pt layer/Au layer (20 nm/20 nm) layered structure. Therefore, by replacing the second electrode 52 of the electron emitting device 100 produced with the aforementioned layered structure, its lifetime will be prolonged to about 250 hours.

Figure 9:
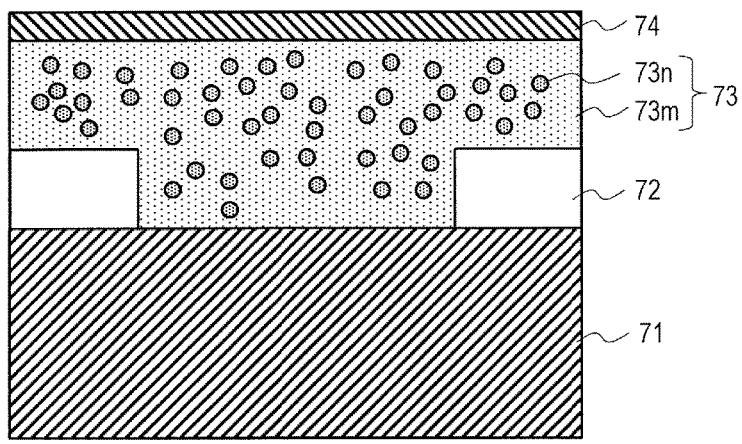
FIG. 9 is a schematic cross-sectional view showing an electron emitting device 200 according to Comparative Example.
Figure 10:
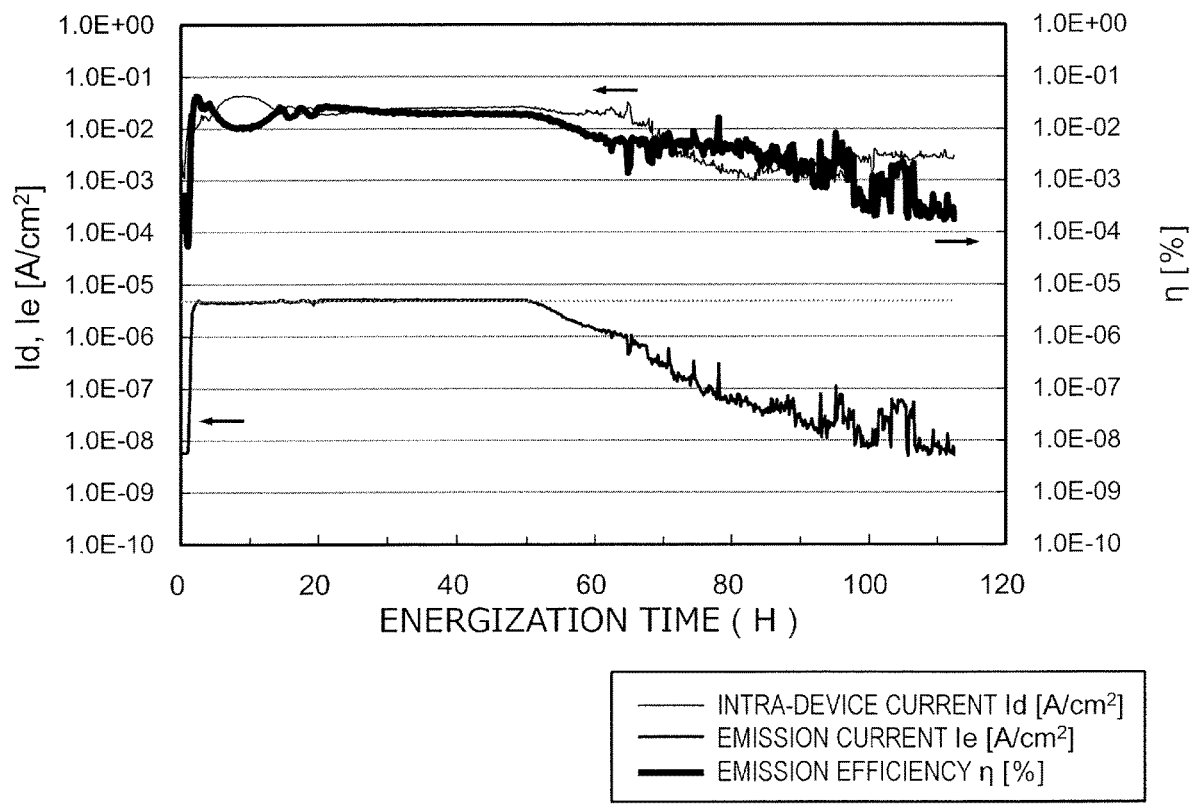
FIG. 10 is a diagram showing a result of an energization test for the electron emitting device of Comparative Example.

For comparison sake, a reference electron emitting device 200 was produced as shown in FIG. 9, and was similarly evaluated. FIG. 10 shows a result of an energization test (electron emission characteristics) for the electron emitting device 200 of Comparative Example. In FIG. 10, the intra-device current Id, the emission current Ie, and the emission efficiency η are plotted against energization time.

The construction of the prototyped electron emitting device is as follows.

first electrode 71: JIS A1050 (thickness: 0.5 mm)

dielectric layer 72: an anodic oxidized alumina layer (a porous alumina layer subjected to a sealing treatment), having a thickness of 4 μm semi-conductive layer 73: thickness of 1 μm to 2 μm insulator 73m: silicone resin Ag nanoparticles 73n: alcohol derivative-coated Ag nanoparticles contained in the aforementioned Ag nanoparticle dispersion, having an average particle size of 6 nm and accounting for 1.5 mass % with respect to silicone resin second electrode 74: an Au layer (thickness 40 nm)

device size (size of the second electrode 74): 5 mm×5 mm

The dielectric layer 72 was formed by a method similar to that of the dielectric layer 22 of the electron emitting device 100 described with reference to FIG. 2A.

As can be seen from FIG. 10, the electron emitting device 200 produced as Comparative Example had a lifetime of about 50 hours. The lifetime of the electron emitting device 200 of Comparative Example was evaluated similarly to the electron emitting device 100 of Example.

Figure 11:
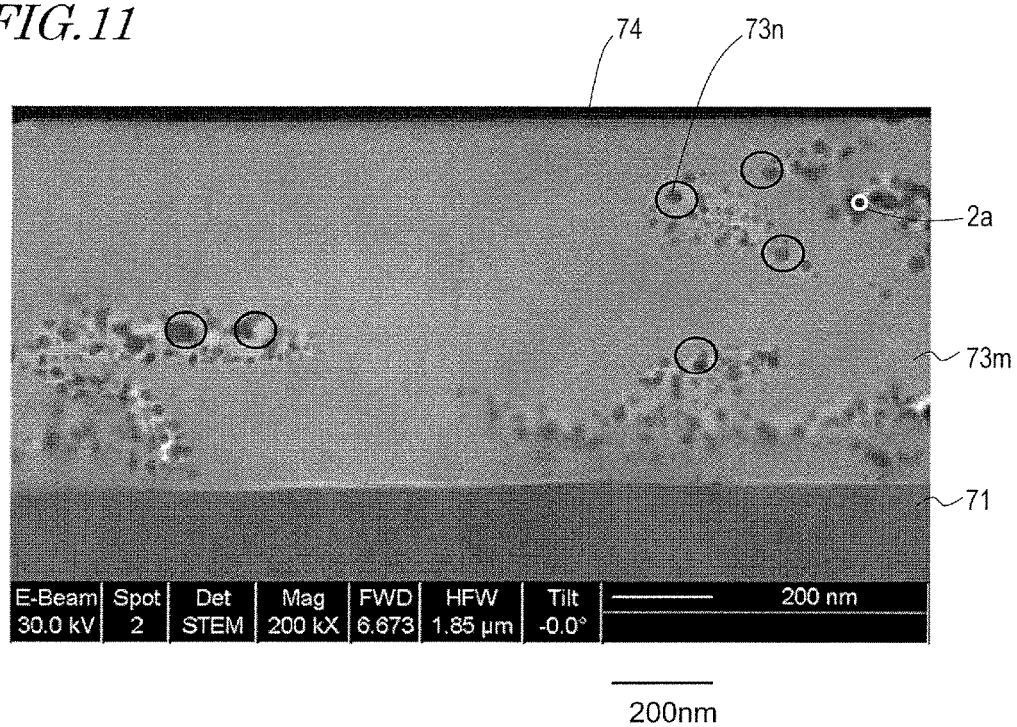
FIG. 11 is a diagram showing a cross-sectional STEM image of a semi-conductive layer containing Ag nanoparticles, in the electron emitting device of Comparative Example.
Figure 12:
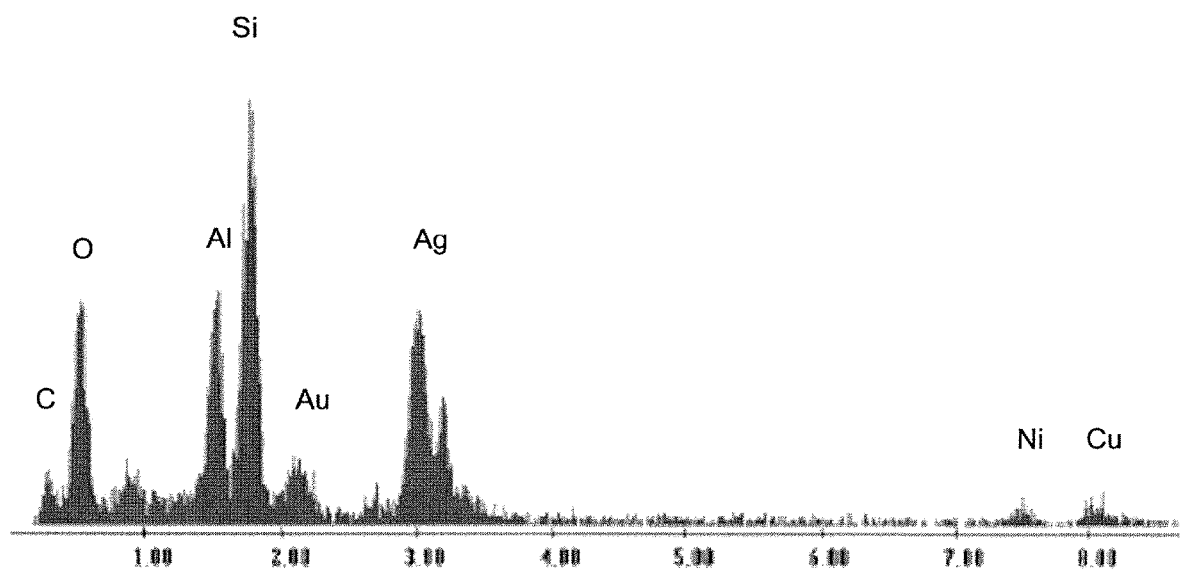
FIG. 12 is a diagram showing a result of EDX analysis in a cross section (a region indicated with an open circle 2a in FIG. 11) of the semi-conductive layer of the electron emitting device of Comparative Example.

FIG. 11 shows an example cross-sectional STEM image of the electron emitting device 200 of Comparative Example (not energized yet). FIG. 12 is a diagram showing a result of EDX analysis in a cross section of FIG. 11 (a region indicated with an open circle 2a in FIG. 11).

As can be seen from FIG. 11, Ag nanoparticles are present in regions indicated by circles in FIG. 11, for example. Within the silicone resin, a plurality of places where Ag nanoparticles are aggregated (e.g., inside the open circle 2a in FIG. 11) are created. The places where Ag nanoparticles are aggregated are nonuniformly distributed within the silicone resin.

Presumably, the distribution of Ag nanoparticles (including also a migration that may occur upon electric field application) may be somehow related to the electron emission characteristics and/or the device lifetime; however, no specific correlation has been established yet. However still, the electron emitting device according to an embodiment of the present invention allows Ag nanoparticles to be supported in the pores of the porous alumina layer, and the Ag nanoparticle distribution can be controlled by controlling the opening diameter, depth, interpore distance, etc., of the pores. Therefore, the characteristics of the electron emitting device can be improved and/or a long lifetime can be achieved.

Next, three kinds of electron emitting devices (test samples Nos. 1 to 3) as shown in Table 1 below were evaluated.

As illustrated herein, when the first electrode is formed by using a relatively rigid aluminum substrate (thickness 0.2 mm or more) containing aluminum with a purity of not less than 99.00 mass % and not more than 99.99 mass %, the aluminum substrate can be utilized as a support substrate, so that the electron emitting device can be efficiently produced.

Test samples Nos. 1 to 3 differ from one another with respect to the composition (e.g., aluminum content) of the aluminum substrate 12 used in forming the first electrode 12. The construction of test sample No. 1 (thickness: 0.5 mm) and the method of production it are basically identical with those of the electron emitting device 100 described with reference to FIG. 7 and FIG. 8. However, herein, the following steps were alternated to a total of three times each: a step of adding dropwise 200 μL (microliter) of the aforementioned Ag nanoparticle dispersion onto the porous alumina layer 32A (a region which is about 5 mm×about 5 mm); and a step of thereafter performing spincoating under conditions of 500 rpm for 5 seconds, and then 1500 rpm for 10 seconds. Thereafter, heating was performed at 150° C. for 1 hour. Test samples No. 2 (thickness: 0.5 mm) and No. 3 (thickness: 0.2 mm) were identical with test sample No. 1 except for the composition of the aluminum substrate 12.

Table 1 shows the main component in the composition of the respective aluminum substrate constituting the first electrode 12 of test samples Nos. 1 to 3.

Test sample No. 1 was produced by using JIS A1050 as the aluminum substrate 12. JIS A1050 has the following composition (mass %).

Si: 0.25% or less, Fe: 0.40% or less, Cu: 0.05% or less, Mn: 0.05% or less, Mg: 0.05% or less, Zn: 0.05% or less, V: 0.05% or less, Ti: 0.03% or less, others: each 0.03% or less, Al: 99.50% or more Test sample No. 2 was produced by using JIS A1100 as the aluminum substrate 12. JIS A1100 has the following composition (mass %).

Si+Fe: 0.95% or less, Cu: 0.05% to 0.20%, Mn: 0.05% or less, Zn: 0.10% or less, others: each 0.05% or less and altogether 0.15% or less, Al: 99.00% or more Test sample No. 3 was produced by using an aluminum base material containing aluminum in an amount of 99.98 mass % or more as the aluminum substrate 12. The aluminum substrate of test sample No. 3 had the following composition (mass %).

Si: 0.05% or less, Fe: 0.03% or less, Cu: 0.05% or less, Al: 99.98% or more

TABLE 1

| test sample | composition (mass %) | | | | | | | |
|---|---|---|---|---|---|---|---|---|
| | Si | Fe | Cu | Mn | Mg | Zn | Ti | Al |
| No. 1 | ≤0.25 | ≤0.40 | ≤0.05 | ≤0.05 | ≤0.05 | ≤0.05 | ≤0.03 | ≥99.50 |
| No. 2 | Si + Fe: ≤0.95 | | 0.05 to 0.20 | ≤0.05 | — | ≤0.10 | — | ≥99.00 |
| No. 3 | ≤0.05 | ≤0.03 | ≤0.05 | — | — | — | — | ≥99.98 |

The energization test for test samples Nos. 1 to 3 was performed basically similarly to the energization test described with reference to FIG. 8. However, for simplicity's sake, no feedback control for the driving voltage Vd was performed. Specifically, after performing the aforementioned "forming" treatment, the driving voltage Vd (a rectangular wave having a frequency of 2 kHz and a duty ratio of 0.5) was increased to 26 V at a rate of 0.05 V per cycle, and thereafter maintained at 26 V. Note that one cycle of intermittent driving consists of an ON period of 16 seconds and an OFF period of 4 seconds. The driving environment was 20 to 25° C., with a relative humidity RH of 30% to 40%.

In any of test samples Nos. 1 to 3, when the driving voltage Vd was about 10 V or more, the emission current Ie gradually increased. By confirming that the emission current Ie increased with an increasing driving voltage Vd, it was determined that the sample was operating as an electron emitting device. Thus, it was confirmed that each of test samples Nos. 1 to 3 was operating as an electron emitting device.

Table 2 shows results of determining an average value of emission current Ie for each test sample. In Table 2, "Δ" indicates that an average value of emission current Ie was not less than 0.001 μA/cm$^2$ but less than 0.01 μA/cm$^2$; "○" indicates that an average value of emission current Ie was not less than 0.01 μA/cm$^2$ but less than 0.1 μA/cm$^2$; and "⊚" indicates that an average value of emission current Ie was not less than 0.1 μA/cm$^2$ but less than 4.8 μA/cm$^2$.

TABLE 2

| | test sample | | |
|---|---|---|---|
| | No. 1 | No. 2 | No. 3 |
| average value of emission current Ie | ○ | ⊚ | Δ |

Test sample No. 2, in which the purity (i.e., ratio of aluminum content of the aluminum substrate) was lower than that of test sample No. 1, had an average value of emission current Ie which was greater than that of test sample No. 1. On the other hand, test sample No. 3, in which the purity (ratio of aluminum content) of the aluminum substrate was higher than that of test sample No. 1, had an average value of emission current Ie which was smaller than that of test sample No. 1. Thus, as the purity (ratio of aluminum content) of the aluminum substrate decreased, the average value of emission current Ie increased.

However, the aforementioned energization test only illustrates exemplary driving conditions. Depending on the driving conditions of the electron emitting device, the value of emission current Ie may vary. Under operation with a large average value of emission current Ie (i.e., amount of electron emission per unit time), the duration in which operation as an electron emitting device is possible may decrease. As used herein, "the duration in which operation as an electron emitting device is possible" means the period from the moment at which operation as an electron emitting device is confirmed to the moment at which the value of emission current Ie begins to decrease for the same driving voltage Vd; note that this definition differs from that of "lifetime" (i.e., the length of time during which the emission current Ie maintained a certain value) which was described with reference to FIG. 8, for example.

The value of emission current and the duration of operation that is expected of an electron emitting device may vary depending on the application (i.e., driving conditions). However, in applications where large emission current values are required, for example, it is preferable to use an aluminum base material with a relatively low aluminum purity (not less than 99.00 mass % and not more than 99.50 mass %). In applications where long hours of operation is highly regarded, for example, it is preferable to use an aluminum base material having a relatively high aluminum purity (not less than 99.50 mass % and not more than 99.98 mass %).

The exact mechanism by which the aluminum purity affects the characteristics of the electron emitting device is not clear as yet. However, as seen from Table 1, any element that is contained as an impurity in the aluminum substrate used herein, except for Mg, is an element which has a high standard electrode potential (i.e., so-called "noble") as compared to aluminum. Therefore, an impurity element(s) (e.g., iron) that is more noble than aluminum may possibly be affecting the characteristics of the electron emitting device.

The inventors have prototyped electron emitting devices by using the above-described method, some of which did not properly operate. The inventors have studied the various structures and methods of producing these electron emitting devices, thus finding that such a problem is suppressed in an electron emitting device which is produced with the following method.

With reference to FIGS. 13A, 13B, 13C, 13D and 13E, and FIGS. 14A, 14B, 14C and 14D, another method of producing an electron emitting device according to an embodiment of the present invention, and the structure of an electron emitting device 100A which is produced by that method will be described. FIGS. 13A, 13B, 13C, 13D and 13E and FIGS. 14A, 14B, 14C and 14D are schematic cross-sectional views for describing this other method of producing an electron emitting device according to an embodiment of the present invention. Hereinafter, differences from the production method described with reference to FIGS. 2A, 2B and 2C will mainly be described.

Figure 13A:
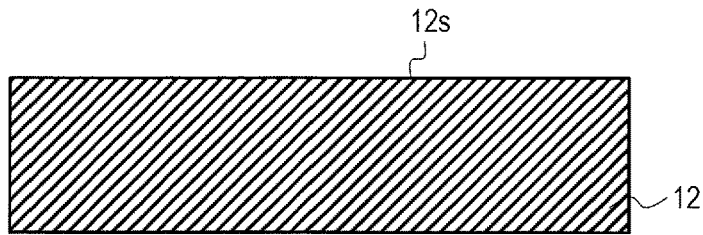
FIGS. 13A, 13B, 13C, 13D and 13E are schematic cross-sectional views for describing another method of producing an electron emitting device according to an embodiment of the present invention.

First, as shown in FIG. 13A, an aluminum substrate 12 is provided.

Figure 13B:
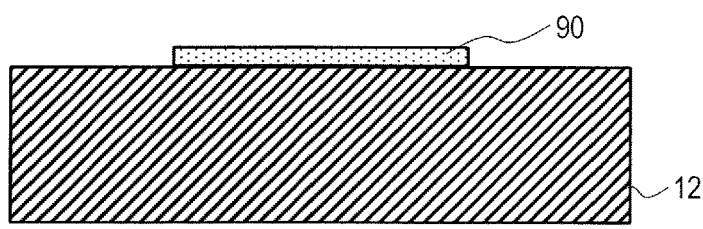

Next, as shown in FIG. 13B, a mask (dielectric member) 90 partially covering a surface 12s of the aluminum substrate 12 is formed. The mask 90 is formed so as to cover a device formation region of the surface 12s of the aluminum substrate 12.

Figure 13C:
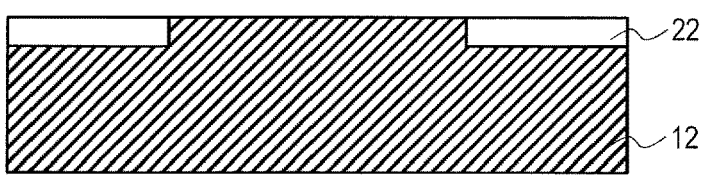

By anodizing portions of the surface 12s of the aluminum substrate 12 that are not covered by the mask 90, as shown in FIG. 13C, an anodized layer 22 is formed. The anodized layer 22 constitutes a dielectric layer (which may be referred to as an "inter-electrode dielectric layer") 22 that partially covers the surface 12s of the aluminum substrate 12. The anodized layer 22 includes a porous alumina layer, for example. A sealing treatment may further be applied to the anodized layer 22.

Figure 13D:
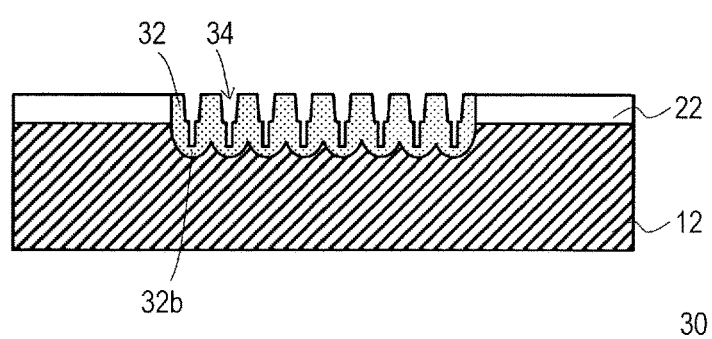

Next, as shown in FIG. 13D, the surface 12s of the aluminum substrate 12 is anodized, thereby forming a porous alumina layer 32 having a plurality of pores 34. At this point, within the aluminum substrate 12, an aluminum remaining layer which remained without being anodized constitutes a first electrode 12.

Figure 13E:
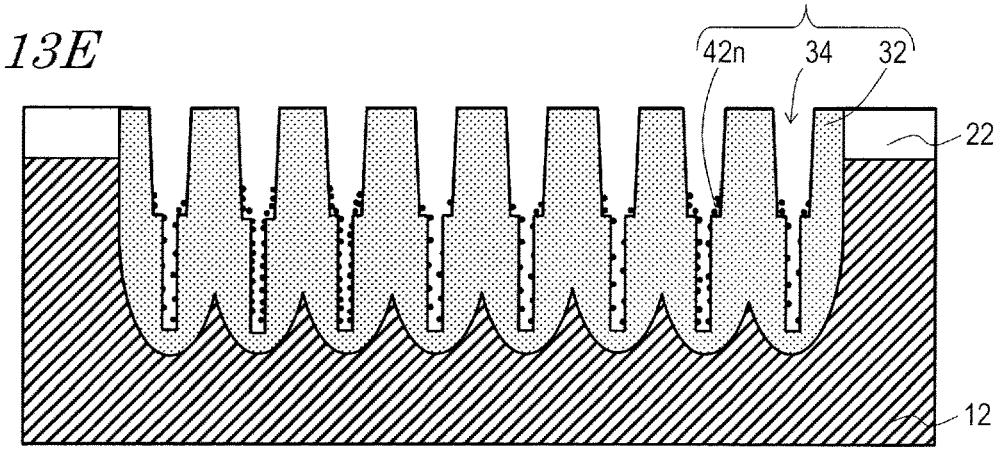

Next, as shown in FIG. 13E, Ag nanoparticles 42n are applied into the plurality of pores 34, thereby forming a semi-conductive layer 30, which includes the porous alumina layer 32 and Ag nanoparticles 42n supported in the plurality of pores 34.

Figure 14A:
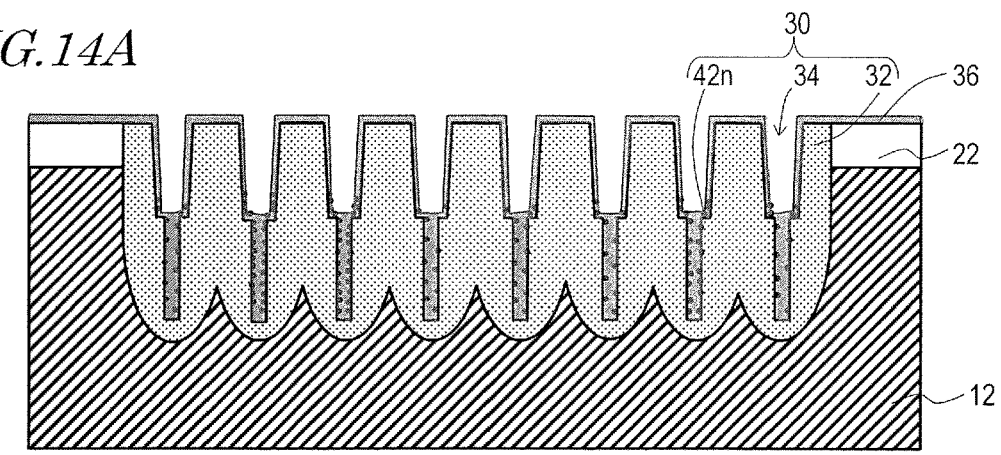
FIGS. 14A, 14B, 14C and 14D are schematic cross-sectional views for describing another method of producing an electron emitting device according to an embodiment of the present invention.

Next, as shown in FIG. 14A, a dielectric layer-forming solution 36 is applied (e.g., via coating or printing) on substantially the entire surface of the aluminum substrate 12. As used herein, "substantially the entire surface" includes at least the device formation region of the aluminum substrate 12. When the aluminum substrate 12 includes a plurality of device formation regions that are spaced apart from one another, for example, the dielectric layer-forming solution 36 may be applied in at least each device formation region. The device formation region is defined as a region in which a second electrode 52 is formed, for example. As shown in FIG. 14A, the dielectric layer-forming solution 36 is applied over the porous alumina layer 32 and onto the side surfaces of the plurality of pores 34, for example.

Figure 14B:
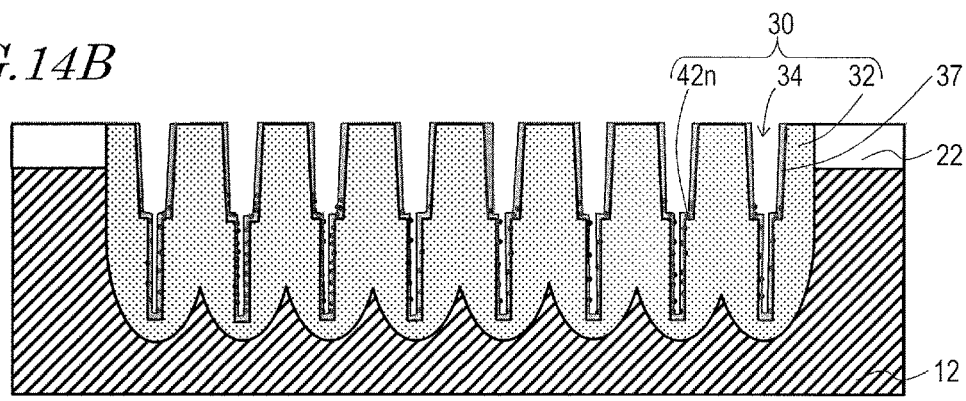

Next, by at least reducing the solvent contained in the dielectric layer-forming solution 36, a dielectric layer 37 is formed, as shown in FIG. 14B. In other words, by reducing or removing the solvent contained in the dielectric layer-forming solution 36, the dielectric layer 37 is formed. The dielectric layer 37 being formed here may contain some solvent that was contained in the dielectric layer-forming solution 36. However, the solvent contained in the dielectric layer 37 is smaller in amount than the solvent contained in the dielectric layer-forming solution 36.

In the case where the dielectric layer 37 contains a solvent, after forming the second electrode 52, a "forming" treatment may be performed, for example, to further reduce the solvent contained in the dielectric layer 37. For example, by performing the "forming" treatment, baking of the dielectric layer 37 may be carried out.

Figure 14C:
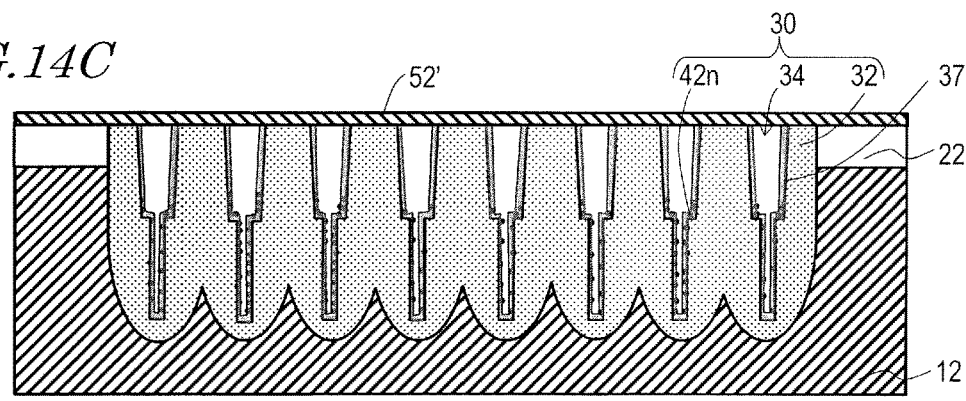

Next, as shown in FIG. 14C, an electrically conductive film 52' is deposited on the dielectric layer 37 by sputtering or the like, for example.

Figure 14D:
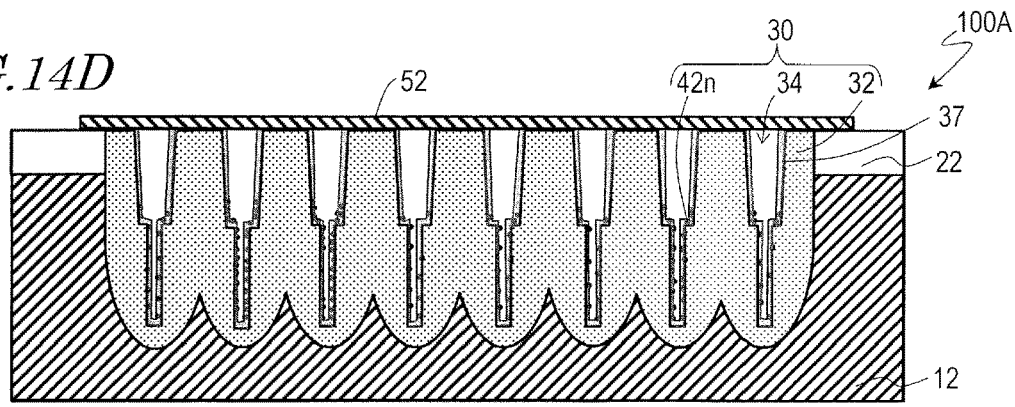

Thereafter, as shown in FIG. 14D, the electrically conductive film 52' is patterned, thereby forming a second electrode 52.

Thus, the electron emitting device 100A is produced.

As described above, in an electron emitting device produced by the above method, the problem of failure to properly operate was found to be suppressed. According to a study by the inventors, a possible reason why some prototyped electron emitting devices failed to properly operate may be an increase in the electrical conductivity of the semi-conductive layer 30 and and/or a decrease in the insulation ability of the dielectric layer 22 formed between the first electrode 12 and the second electrode 52. For example, if Ag nanoparticles, which are minute electrically-conductive particles, are added in excess to the porous alumina layer 32 during a fabrication process of the electron emitting device, the electrical conductivity of the semi-conductive layer 30 may increase excessively, such that electrons cannot be emitted. Moreover, when the dielectric layer 22 is an anodized layer 22 which has not undergone a sealing treatment, for example, any vapor deposition material used when depositing an electrically conductive film for forming the second electrode 52 and/or Ag nanoparticles may possibly adhere and diffuse inside the dielectric layer (anodized layer) 22, thus lowering the insulation ability of the anodized layer 22. In the case where the second electrode 52 contains a metal, the electrically conductive film for forming the second electrode 52 contains the metal. Note that the method of forming the second electrode 52 is not limited to this example. This is a mere conjecture by the inventors, which should not be interpreted as limiting the present invention in any way.

On the other hand, in the production method described with reference to FIGS. 13A, 13B, 13C, 13D and 13E and FIGS. 14A, 14B, 14C and 14D, prior to forming the second electrode 52, the dielectric layer-forming solution 36 is applied onto substantially the entire surface of the aluminum substrate 12. The electron emitting device 100A which is produced by this method differs from the electron emitting device 100 shown in FIG. 1, for example, in that the dielectric layer 37 formed over the porous alumina layer 32 and in the plurality of pores 34 is further included. Because of including the dielectric layer 37 made with the dielectric layer-forming solution 36, the electron emitting device 100A can provide appropriate electrical insulation between the first electrode 12 and the second electrode 52 even if an increase in the electrical conductivity of the semi-conductive layer 30 and/or a decrease in the insulation ability of the dielectric layer 22 occurs. As a result of this, an electron emitting device can be provided in which the problem of failure to properly operate is suppressed.

The dielectric layer-forming solution 36 contains, for example, a polymerization product having siloxane bonds (which may be referred to as a "polysiloxane-based compound") and a solvent. The polysiloxane-based compound may be, for example, a polymerization product in which siloxane bonds are formed in a three-dimensional structure based on reactive groups such as the silanol group of polysiloxane as cross-linking points.

As the dielectric layer-forming solution 36, OCD T-1200V available from Tokyo Oka Kogyo Co., Ltd. can be used, for example. OCD T-12 1200V is represented as $(HSiO_{1.5})_n$, and with heating (bake), its terminal —OH groups can condense to form a three-dimensional mesh structure. The chemical structural formula of OCD T-12 1200V is represented in [Formula 1]. When OCD T-12 1200V is used as the dielectric layer-forming solution 36, the dielectric layer-forming solution 36 and the dielectric layer 37 contain a polymerization product having siloxane bonds, and the dielectric layer 37 contains substantially no carbon.

[Formula 1]

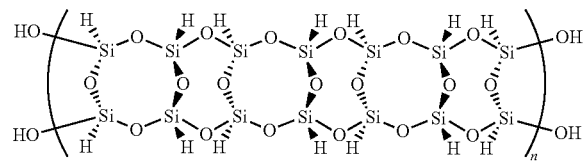

Alternatively, as the dielectric layer-forming solution 36, a hybrid material of an inorganic material and an organic material may be used. Examples of hybrid materials of an inorganic material and an organic material may be siloxane (e.g., S03 series, S05 series, and S06 series available from Merck Ltd.) or silazane.

The dielectric layer-forming solution 36 may be applied onto the aluminum substrate 12 via coating, e.g., spin coating. Depending on the conditions of spin coating, the thickness of the dielectric layer-forming solution 36 to be applied onto the aluminum substrate 12 can be adjusted. Moreover, by diluting the dielectric layer-forming solution 36 with a solvent, the thickness of the dielectric layer 37 to be formed can be reduced.

In the production method described with reference to FIGS. 13A, 13B, 13C, 13D and 13E and FIGS. 14A, 14B, 14C and 14D, too, an aluminum layer which is formed on a substrate (e.g., a glass substrate) may be used instead of an aluminum substrate.

Figure 15A:
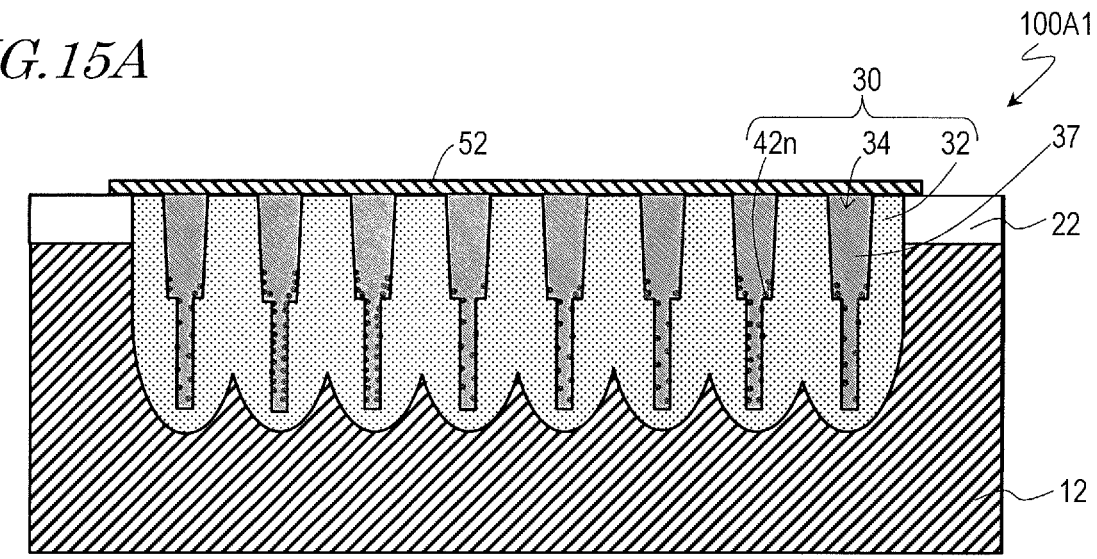
FIG. 15A is a schematic cross-sectional view of an electron emitting device 100A1 according to another embodiment of the present invention.
Figure 15B:
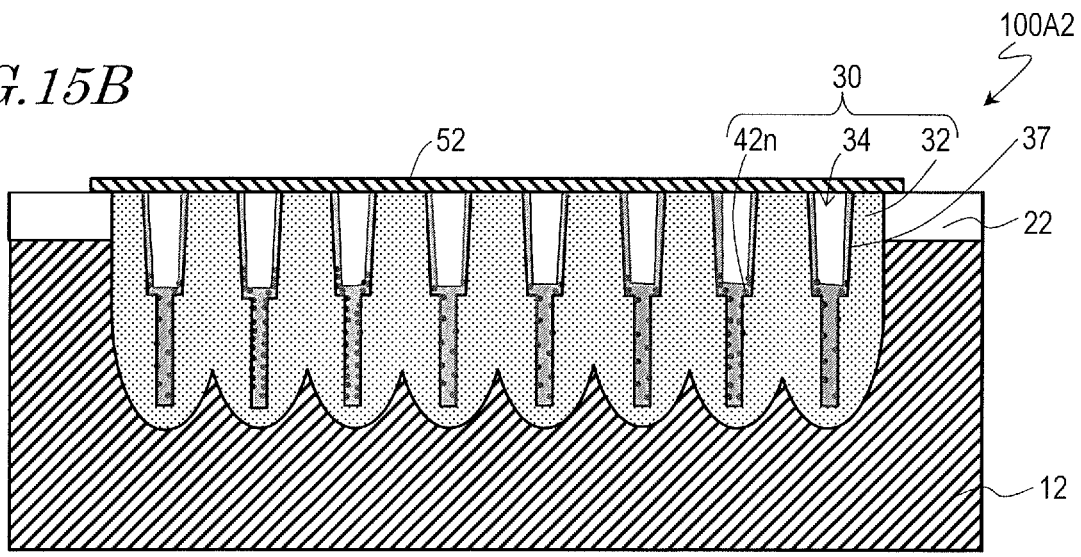
FIG. 15B is a schematic cross-sectional view of an electron emitting device 100A2 according to still another embodiment of the present invention.

With reference to FIG. 15A and FIG. 15B, other exemplary structures for the electron emitting device produced by the method described with reference to FIGS. 13A, 13B, 13C, 13D and 13E and FIGS. 14A, 14B, 14C and 14D will be described. FIG. 15A and FIG. 15B are, respectively, cross-sectional views schematically showing electron emitting devices 100A1 and 100A2.

As shown in FIG. 14C, the dielectric layer 37 of the electron emitting device 100A is formed on the porous alumina layer 32 and on side surfaces of the plurality of pores 34. On the other hand, as shown in FIG. 15A, the dielectric layer 37 of the electron emitting device 100A1 is formed on the porous alumina layer 32, and also in a manner of essentially completely filling the plurality of pores 34.

As shown in FIG. 15B, the dielectric layer 37 of the electron emitting device 100A2 is formed on the porous alumina layer 32 and on side surfaces of the plurality of pores 34, and is also applied in a manner of partially filling the plurality of pores 34 (i.e., part of the way along the depth direction).

Note that embodiments of the present invention are not limited to the illustrated examples. For example, in the drawings, the dielectric layer 37 is illustrated as being formed so as to entirely cover the side surfaces of the pores 34, embodiments of the present invention are not limited thereto.

An electron emitting device was produced by the method described with reference to FIGS. 13A, 13B, 13C, 13D and 13E and FIGS. 14A, 14B, 14C and 14D, and was evaluated. Production of the electron emitting device was performed as follows. Note that conditions other than those mentioned below are identical to those for the electron emitting device 100 described with reference to FIG. 7 and FIG. 8.

dielectric layer-forming solution 36: obtained by diluting OCD T-12 1200V available from Tokyo Oka Kogyo Co., Ltd. (which in itself is a five-times dilution of $(HSiO_{1.5})_n$ with PGMEA (propyleneglycol monomethylether acetate)) three-fold with PGMEA (solvent)

method of applying the dielectric layer-forming solution 36: spin coating (3000 rpm for 30 seconds)

method of forming the dielectric layer 37: the dielectric layer-forming solution 36 was allowed to dry naturally thickness of the dielectric layer 37: 500 nm In an electron emitting device which was produced with the method described with reference to FIGS. 13A, 13B, 13C, 13D and 13E and FIGS. 14A, 14B, 14C and 14D, the problem of failure to properly operate was suppressed, as compared to the electron emitting device 100 described with reference to FIG. 7 and FIG. 8.

Next, electron emitting devices of test samples Nos. 4 to 6 were produced by varying the content ratio of polymerization product having siloxane bonds within the dielectric layer-forming solution 36, and were evaluated.

Test samples Nos. 4 to 6 were produced under the conditions in Table 3, by using the method described with reference to FIGS. 13A, 13B, 13C, 13D and 13E and FIGS. 14A, 14B, 14C and 14D. Unless otherwise specified, conditions other than the following are identical with those for the electron emitting device 100 described with reference to FIG. 7 and FIG. 8.

TABLE 3

|  | test sample No. 4 | test sample No. 5 | test sample No. 6 |
|---|---|---|---|
| dielectric layer-forming solution 36 | $(HSiO_{1.5})_n$ is diluted 10-fold with PGMEA | $(HSiO_{1.5})_n$ is diluted 15-fold with PGMEA | $(HSiO_{1.5})_n$ is diluted 45-fold with PGMEA |
| content ratio of $(HSiO_{1.5})_n$ in dielectric layer-forming solution 36 [mass %] | 10 | 7 | 2 |
| method of applying dielectric layer-forming solution 36 | spin coating (2000 rpm for 30 seconds) | spin coating (2000 rpm for 30 seconds) | spin coating (2000 rpm for 30 seconds) |
| viscosity of dielectric layer-forming solution 36 [cP] | 0.65 | 0.61 | 0.55 |
| thickness of dielectric layer [nm] | 500 | 350 | 50 |

The dielectric layer-forming solution 36 was obtained by appropriately diluting the aforementioned OCD T-12 1200V available from Tokyo Oka Kogyo Co., Ltd. with PGMEA.

In Table 3, "thickness of dielectric layer" refers to the thickness of a dielectric layer which was obtained as follows: applying the dielectric layer-forming solution 36 under the same conditions as the test samples onto a flat surface, and thereafter, removing the solvent therefrom by heating it at 100° C. for 5 minutes. Therefore, given the same amount of dielectric layer-forming solution 36 being applied, the "thickness of dielectric layer" would be proportional to the solid content concentration in the dielectric layer-forming solution 36. Herein, the "thickness of dielectric layer" was determined from a cross-sectional SEM image.

In any of test samples Nos. 4 to 6, after the dielectric layer-forming solution 36 was applied, the dielectric layer-forming solution 36 was allowed to dry naturally, thereby at least reducing the solvent in the dielectric layer-forming solution 36, and thereafter the "forming" treatment as below was performed to form the dielectric layer 37. Also during the "forming" treatment, the solvent in the dielectric layer-forming solution 36 may possibly undergo a further decrease. Note that the solvent in the dielectric layer 37 may possibly decrease even while a test sample of electron emitting device is being operated.

An energization test for test samples Nos. 4 to 6 was performed basically similarly to the energization test described with reference to FIG. 8. Specifically, first, the "forming" treatment was performed as follows: using a rectangular wave having a frequency of 2 kHz and a duty ratio of 0.5 as the driving voltage Vd to be applied between the first electrode 12 and the second electrode 52, this voltage was increased at a rate of 0.1 V/sec until the emission current Ie reached a predefined value (which herein was 4.8 μA/cm$^2$) or greater, followed by 6 minutes of energization; this procedure was repeated three times. During the "forming" treatment, the applied driving voltage Vd was 20 V at the most. Thereafter, test samples were operated, while applying a feedback control to the driving voltage Vd and the duty ratio as follows: with the driving voltage Vd (a rectangular wave having a frequency of 2 kHz) first having an initial value of 0 V and a duty ratio of 0.3, the value and the duty ratio of the driving voltage Vd were allowed to increase to 26 V and a duty ratio of 0.5 at the most, until the emission current Ie reached a predefined value (which herein was 4.8 μA/cm$^2$) or greater. After the emission current Ie reached a predefined value (which herein was 4.8 μA/cm$^2$), the value and the duty ratio of the driving voltage Vd were adjusted so that the emission current Ie as monitored with the counter electrode 110 remained constant. The driving environment was 25° C. with a relative humidity RH of 55%.

Results of determining the lifetime, emission efficiency η (average value), intra-device current Id (average value), and resistivity ρ (average value) of each of test samples Nos. 4 to 6 are shown in Table 4. Here, regarding the lifetime of each test sample, the duration of time over which the emission current Ie maintained a predefined value (4.8 μA/cm$^2$) was examined. For each of the emission efficiency η, intra-device current Id, and resistivity ρ, an average value over a period during which the emission current Ie maintained a predefined value (4.8 μA/cm$^2$) was determined. The resistivity ρ of each test sample is an electrical resistivity of the semi-conductive layer of the respective test sample, which was determined from the following equation. In test samples Nos. 4 to 6, it is considered that the semi-conductive layer 30 including the porous alumina layer 32 and Ag nanoparticles 42n and the dielectric layer 37 contribute to this resistivity ρ. Hereinafter, any allusion to "resistivity of the semi-conductive layer" may also include contributions of the semi-conductive layer 30 and the dielectric layer 37.

$$\rho[\Omega cm]=(Vd[V]/Id[A/cm^2])\times DR/tp[cm]$$

Herein, DR denotes the duty ratio of the driving voltage Vd, and the thickness tp of the porous alumina layer 32 defines the thickness of the semi-conductive layer 30. The porous alumina layer 32 of test samples Nos. 4 to 6 had a thickness tp of 2.5 [μm]=2.5×10$^{-4}$ [cm]. The thickness of the dielectric layer 37 which was formed on any flat portion of the porous alumina layer 32 was negligibly small relative to the thickness tp of the porous alumina layer 32.

TABLE 4

|  | test sample No. 4 | test sample No. 5 | test sample No. 6 |
|---|---|---|---|
| lifetime [h] | 24 | 33 | 36 |
| emission efficiency η (average value) [%] | 0.0775 | 0.0197 | 0.00781 |
| intra-device current Id (average value) [A/cm$^2$] | 0.0115 | 0.0262 | 0.0764 |
| resistivity ρ (average value) [Ωcm] | 2.85 × 10$^6$ | 1.12 × 10$^6$ | 4.06 × 10$^5$ |

Figure 16:
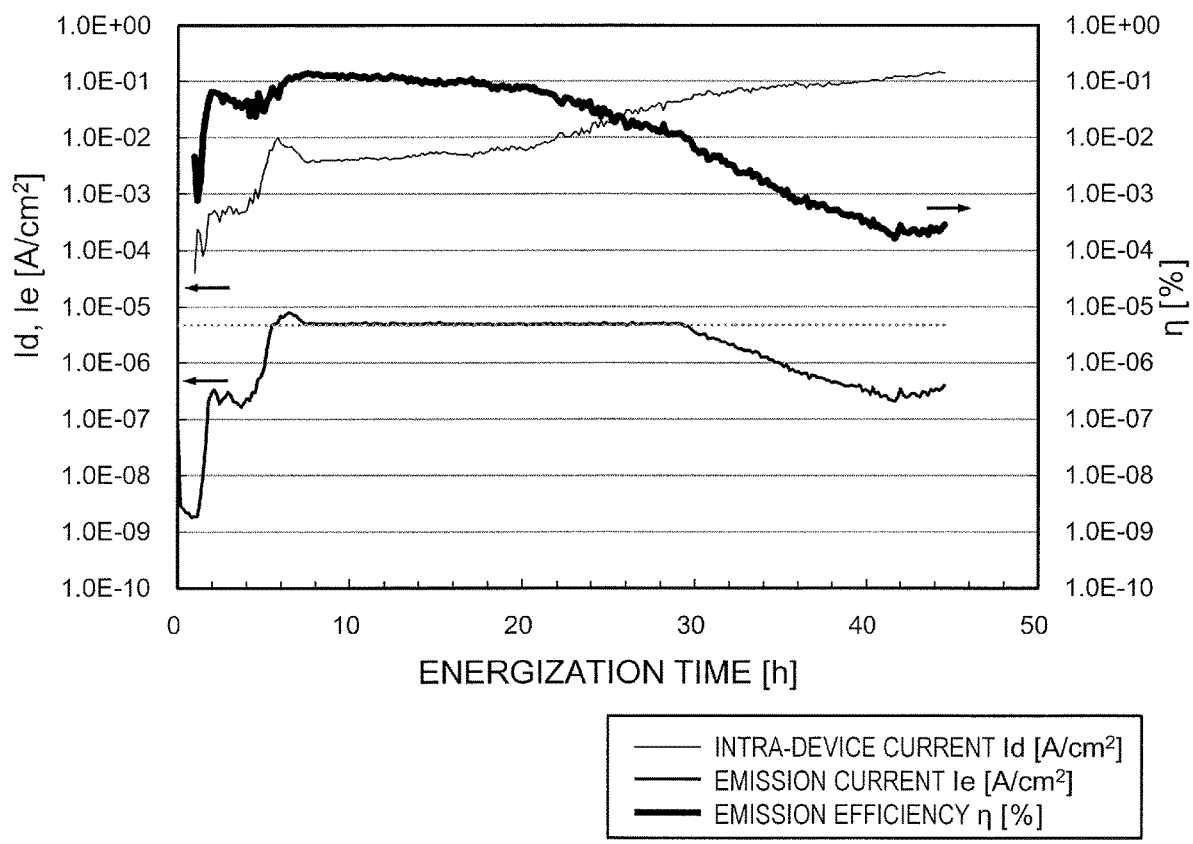
FIG. 16 is a diagram showing a result of an energization test for an electron emitting device of test sample No. 4.
Figure 17:
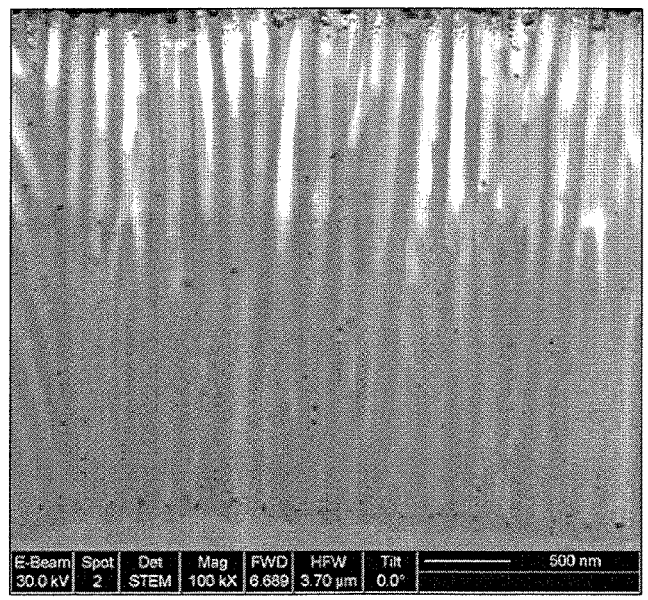
FIG. 17 is a diagram showing a cross-sectional STEM image of a semi-conductive layer containing Ag nanoparticles, in an electron emitting device of test sample No. 4.
Figure 18:
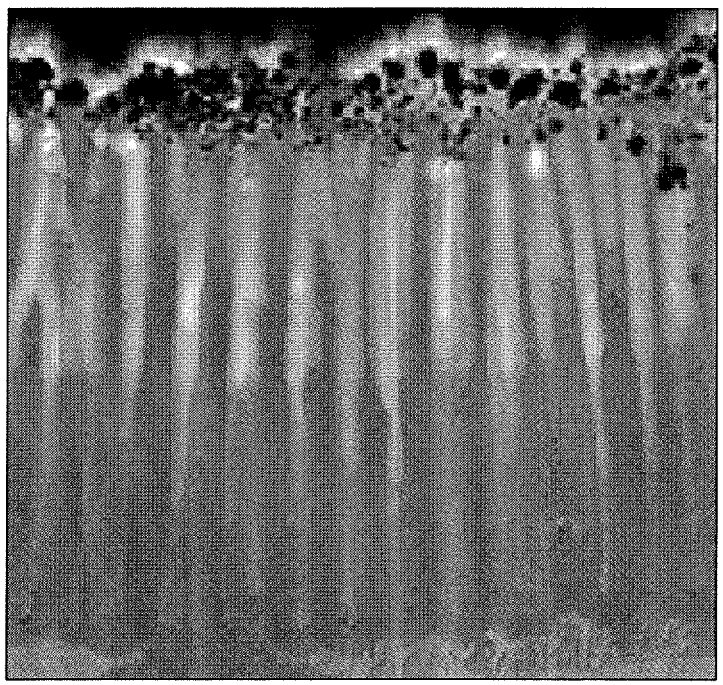
FIG. 18 is a diagram showing a cross-sectional STEM image of a semi-conductive layer containing Ag nanoparticles, in an electron emitting device of test sample No. 5.
Figure 19:
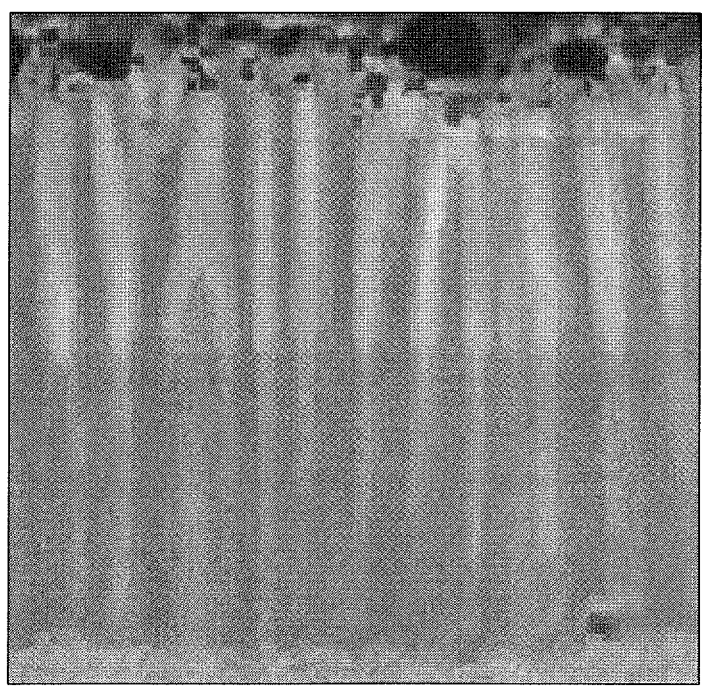
FIG. 19 is a diagram showing a cross-sectional STEM image of a semi-conductive layer containing Ag nanoparticles, in an electron emitting device of test sample No. 6.

FIG. 16 shows a result of an energization test (electron emission characteristics) for test sample No. 4. FIG. 17 to FIG. 19 show exemplary cross-sectional STEM images of the semi-conductive layers (after being energized) of test samples Nos. 4 to 6.

As shown in Table 4, among test samples Nos. 4 to 6, an average value of emission efficiency r was highest in test sample No. 4, which possessed the highest content ratio of polymerization product having siloxane bonds (($HSiO_{1.5})_n$) in the dielectric layer-forming solution 36 among these (10 mass %). The higher the content ratio of polymerization product having siloxane bonds (($HSiO_{1.5})_n$) in the dielectric layer-forming solution 36 was, the higher the average value of emission efficiency η was. The test samples with lower content ratios of polymerization product having siloxane bonds (($HSiO_{1.5})_n$) in the dielectric layer-forming solution 36 had longer lifetimes.

As described above, the emission efficiency 7) of the electron emitting device is expressed as a ratio of the emission current Ie to the intra-device current Id ($\eta$=Ie/Id). In other words, when the emission efficiency $\eta$ is high, the intra-device current Id is small relative to the emission current Ie, and therefore the power consumption can be lowered and the heat generation can be suppressed. Furthermore, this also suppresses influences of heat generation in the surroundings of the electron emitting device. The method of producing an electron emitting device of the present embodiment involves applying a dielectric layer-forming solution on the porous alumina layer and forming a dielectric layer, and thus provides an electron emitting device having a high emission efficiency and requires less power consumption. The electron emitting device according to the present embodiment can be suitably used in applications (i.e., driving conditions where emission efficiency is regarded as more important than lifetime), for example. The driving conditions of the electron emitting device may be adjusted as appropriate depending on its application (i.e., required properties), but there will presumably be many situations where reduced power consumption is an advantage.

In applications where improvement of emission efficiency is preferred, it is preferable that the content ratio of polymerization product having siloxane bonds within the dielectric layer-forming solution is somewhat high (e.g. not less than 7 mass % but less than 20 mass %). The content ratio of polymerization product having siloxane bonds within the dielectric layer-forming solution may be e.g. about 10 mass %.

Although the exact mechanism by which the content ratio of polymerization product having siloxane bonds within the dielectric layer-forming solution affects the characteristics of the electron emitting device is not clear as yet, the inventors may tentatively consider this as follows, for example. However, the following is a mere conjecture by the inventors, which should not be interpreted as limiting the present invention in any way.

As shown in Table 4, depending on the solid content concentration of the dielectric layer-forming solution 36, the electrical resistivity of the semi-conductive layer varies. The higher the content ratio of polymerization product having siloxane bonds (($HSiO_{1.5})_n$) in the dielectric layer-forming solution 36 was, the higher the resistivity $\rho$ of the semi-conductive layer was. A higher resistivity $\rho$ of the semi-conductive layer tends to result in a smaller intra-device current Id, and thus allows the emission efficiency $\eta$ to be increased. From the standpoint of enhancing efficiency, among the above-illustrated test samples, it was presumably in test sample No. 4 that the resistivity of the semi-conductive layer was the most preferable, and it was presumably in test sample No. 4 that the solid content concentration in the dielectric layer-forming solution 36 was the most preferable.

In addition to test samples Nos. 4 to 6 above, the inventors also produced a test sample in which OCD T-12 1200V available from Tokyo Oka Kogyo Co., Ltd. was used as the dielectric layer-forming solution 36 without being diluted with a solvent (i.e., the content ratio of polymerization product having siloxane bonds (($HSiO_{1.5})_n$) in the dielectric layer-forming solution was 20 mass %); however, the emission current Ie of this test sample did not attain the pre-defined value (4.8 $\mu A/cm^2$). One possible cause may be that the resistivity of the semi-conductive layer was too high, which in turn was ascribable to the high solid content concentration in the dielectric layer-forming solution 36. In order for electrons to be stably emitted, the value of intra-device current Id may preferably be somewhat large, and thus the resistivity of the semi-conductive layer is preferably not too high.

The dielectric layer 37 being included may also provide the following advantage. As can be seen from the cross-sectional STEM image of FIG. 17, in test sample No. 4, the Ag nanoparticles are distributed across the entire depth of pores 34 of the porous alumina layer 32. It is considered that the Ag nanoparticles are fixed to the wall surface of the pores 34 by the dielectric layer 37.

Note that, as can be understood from the above calculation formula, the resistivity of the semi-conductive layer may also vary depending on the driving voltage Vd and its duty ratio. Because of having the dielectric layer 37, the electron emitting device according to the present embodiment is able to control the resistivity of the semi-conductive layer more easily. This advantageously provides an ease of obtaining an electron emitting device that has a high emission efficiency.

Embodiments of the present invention may be suitable as an electron emitting device for use in a charger device of an image forming apparatus, or a method of producing the same, for example.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Application No. 2018-069646 filed on Mar. 30, 2018, the entire contents of which are hereby incorporated by reference.

What is claimed is:

1. A method of producing an electron emitting device, comprising:
    step A of providing an aluminum substrate or providing an aluminum layer supported by a substrate;
    step B of anodizing a surface of the aluminum substrate or the aluminum layer to form a porous alumina layer having a plurality of pores;
    step C of applying Ag nanoparticles in the plurality of pores to allow the Ag nanoparticles to be supported in the plurality of pores;
    step D of, after step C, applying a dielectric layer-forming solution onto substantially the entire surface of the aluminum substrate or the aluminum layer, the dielectric layer-forming solution containing, in an amount of not less than 7 mass % but less than 20 mass %, a polymerization product having siloxane bonds;
    step E of, after step D, at least reducing a solvent contained in the dielectric layer-forming solution to form a dielectric layer; and
    step F of, after step E, forming an electrode on the dielectric layer.

2. The method of producing an electron emitting device of claim 1, wherein the dielectric layer-forming solution contains the polymerization product having siloxane bonds in an amount of about 10 mass %.

3. The method of producing an electron emitting device of claim 1, wherein step D comprises a step of applying the dielectric layer-forming solution via coating or printing.

4. The method of producing an electron emitting device of claim 1, wherein step D comprises a step of coating the dielectric layer-forming solution via spin coating.

5. The method of producing an electron emitting device of claim 1, wherein step F comprises: step F1 of depositing an electrically conductive film on the dielectric layer; and step F2 of patterning the electrically conductive film to form the electrode.

6. The method of producing an electron emitting device of claim 1, wherein the electrode comprises a metal.

7. The method of producing an electron emitting device of claim 1, wherein the surface of the aluminum substrate or the aluminum layer provided in step A is partially covered by an inter-electrode dielectric layer.

8. The method of producing an electron emitting device of claim 7, wherein step A comprises: step A1 of providing an aluminum substrate or providing an aluminum layer supported by a substrate; and step A2 of forming the inter-electrode dielectric layer so as to include an anodized layer that is formed by anodizing a portion of the surface of the aluminum substrate or the aluminum layer provided in step A1.

9. The method of producing an electron emitting device of claim 1, wherein step E comprises a step of baking the dielectric layer-forming solution.

10. The method of producing an electron emitting device of claim 1, wherein step E comprises a step of baking the dielectric layer-forming solution at 220° C. or below.

11. The method of producing an electron emitting device of claim 1, wherein step E comprises a step of baking the dielectric layer-forming solution at a boiling point of the solvent or above.

12. The method of producing an electron emitting device of claim 1, wherein step B further comprises an etching step to be performed after the anodization.

13. The method of producing an electron emitting device of claim 12, wherein step B comprises a further anodization step after the etching step.

* * * * *